(12) United States Patent
French et al.

(10) Patent No.: US 7,402,377 B2
(45) Date of Patent: Jul. 22, 2008

(54) USE OF PERFLUORO-N-ALKANES IN VACUUM ULTRAVIOLET APPLICATIONS

(75) Inventors: Roger Harquail French, Wilmington, DE (US); Robert Clayton Wheland, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 671 days.

(21) Appl. No.: 10/903,526

(22) Filed: Jul. 30, 2004

(65) Prior Publication Data

US 2005/0186514 A1    Aug. 25, 2005

Related U.S. Application Data

(60) Provisional application No. 60/551,270, filed on Mar. 8, 2004, provisional application No. 60/491,894, filed on Feb. 20, 2004.

(51) Int. Cl.
*G03F 7/26* (2006.01)
(52) U.S. Cl. ...................................... 430/311
(58) Field of Classification Search ............... 430/311
See application file for complete search history.

(56) References Cited

U.S. PATENT DOCUMENTS

| | | | |
|---|---|---|---|
| 3,462,401 A | | 8/1969 | Kometani et al. |
| 4,760,205 A | * | 7/1988 | Probst et al. ............ 570/137 |
| 5,356,668 A | | 10/1994 | Paton et al. |
| 5,760,139 A | | 6/1998 | Koike et al. |
| 5,853,894 A | | 12/1998 | Brown |
| 6,156,389 A | | 12/2000 | Brown et al. |

FOREIGN PATENT DOCUMENTS

| | | |
|---|---|---|
| EP | 0 584 703 A1 | 3/1994 |
| EP | 0 676 458 B1 | 10/1995 |
| EP | 0 889 066 B1 | 1/1999 |
| EP | 0 889 067 B1 | 1/1999 |
| EP | 0 889 092 A1 | 1/1999 |
| EP | 0 907 088 B1 | 4/1999 |
| WO | WO 94/05498 A1 | 3/1994 |
| WO | WO 96/34052 A1 | 10/1996 |
| WO | WO 97/01599 A1 | 1/1997 |
| WO | WO 97/11134 | 3/1997 |
| WO | WO 00/01758 A1 | 1/2000 |
| WO | WO 01/85811 | 11/2001 |
| WO | WO 02/44226 A1 | 6/2002 |

OTHER PUBLICATIONS

Switkes, et al., "Immersion lithography: Beyond the 65 nm node with optics", Microlithography World, (2003), pp. 4-6, 18 and 20, Massachusetts.
Switkes., "Resolution Enhancement of 157 nm Lithography by Liquid Immersion", Proceedings of SPIE, (2002), pp. 459-465, vol. 4691, Massachusetts.
Switkes., et al., "Immersion Liquids for Lithography in the Deep Ultraviolet", Proceedings of SPIE, (2003), pp. 690-699, vol. 5040, Massachusetts.
Albrecht., "VUV Absorbing Vapours in n-Perfluorocarbons", European Organization for Nuclear Research, (2002) pp. 1-14.
Seki, et al., "Electronic Structure of Poly(tetrafluoroethylene) Studied by UPS, VUV Absorption, and Band Calculations", Physica Scripta, (1990), pp. 167-171, vol. 41, Japan.
Belanger, et al., "The Far-Ultraviolet Spectra of Perfluoro-Normal-Paraffins", Chemical Physics Letters. (1969), pp. 649-651, vol. 3, No. 8, Canada.
Lombos, et al., "The Electronic Spectra of Normal Paraffin Hydrocarbons", Chemical Physics Letters (1967), pp. 42-43, vol. 1, Amsterdam.
PCT/US2004/024761, International Search Report dated Jan. 19, 2005.

* cited by examiner

*Primary Examiner*—Kathleen Duda

(57) ABSTRACT

This invention concerns liquid perfluoro-n-alkanes for use in applications demanding high transparency at UV wavelengths ranging from about 150 to 165 nm, especially 157 nm. Uses include optical couplants, optical cements, optical elements, optical inspection media for semiconductor wafers and devices, and most especially immersion photolithography at 157 nm exposure wavelength.

12 Claims, 18 Drawing Sheets

- is a schematic drawing of the Harrick DLC liquid specimen cell, showing the annular spacers, windows and related parts.

- describes the absorbance in units of inverse centimeters for Hexafluoropropylene Cyclic Dimer (example C1) versus wavelength lambda ($\lambda$) in units of nanometers.
  Results below ~160 nm (dashed line) and ~150 (solid line) exhibit saturation of the absorbance measurement.

- describes the absorbance in units of inverse centimeters for Perfluoro-2-methylpentane (example C2) versus wavelength lambda ($\lambda$) in units of nanometers. Results below ~150 nm exhibit saturation of the absorbance measurement.

- describes the absorbance in units of inverse centimeters for Perfluorooctane (example C3) versus wavelength lambda ($\lambda$) in units of nanometers.

Results below ~160 nm exhibit saturation of the absorbance measurement.

- describes the absorbance in units of inverse centimeters for Perfluorononane (example C4) versus wavelength lambda ($\lambda$) in units of nanometers.

Results below ~180 nm exhibit saturation of the absorbance measurement.

- describes the absorbance in units of inverse centimeters for Perfluoro(1,3-dimethylcyclohexane) (example C5) versus wavelength lambda ($\lambda$) in units of nanometers.

- describes the absorbance in units of inverse centimeters for Perfluoro-trans-decalin (example C6) versus wavelength lambda ($\lambda$) in units of nanometers. Results below ~165 nm exhibit saturation of the absorbance measurement.

Figure 8

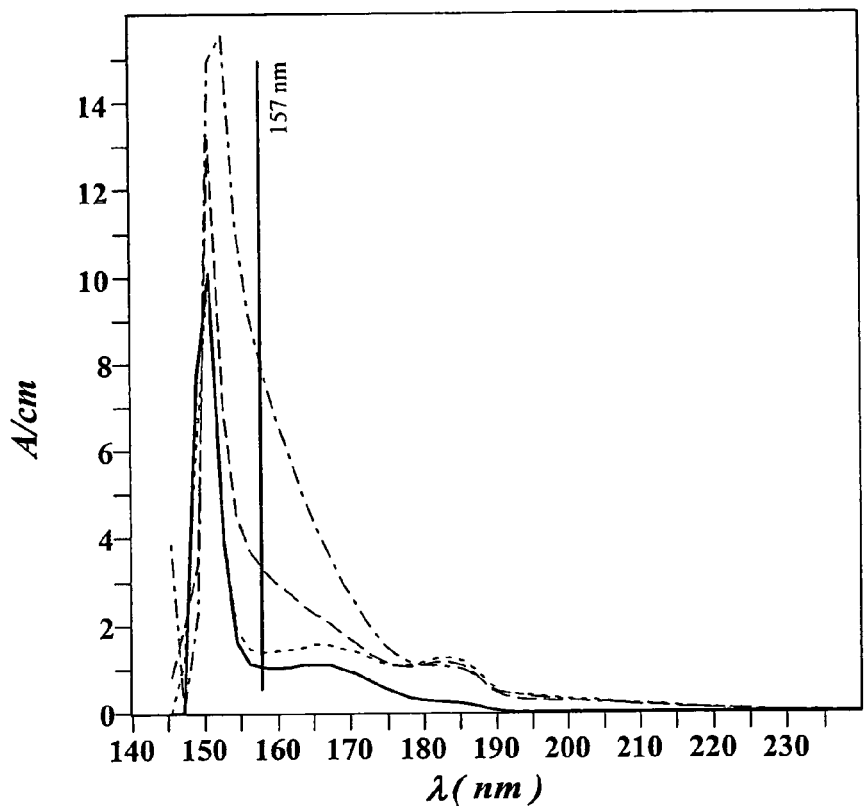

- describes the absorbance in units of inverse centimeters for Perfluorohexane (example 1) versus wavelength lambda (λ) in units of nanometers for a sample a) loaded in Air (dash dot line), b) loaded in $N_2$ (dotted line), c) loaded in $N_2$ and shaken with water (dashed line), and d) loaded in $N_2$ (solid line) shaken with water and dried with 3A molecular sieves. Results below ~152 nm exhibit saturation of the absorbance measurement.

- describes the absorbance in units of inverse centimeters for Perfluoropentane (example 2) versus wavelength lambda (λ) in units of nanometers for a sample a) loaded in Air (dash dot line), b) loaded in $N_2$ (dotted line), c) loaded in $N_2$ and shaken with water (dashed line), and d) loaded in $N_2$, shaken with water and dried with 3A molecular sieves (solid line).

- describes the absorbance in units of inverse centimeters for Perfluorohexane (example 3) versus wavelength lambda ($\lambda$) in units of nanometers. Results below ~150 nm exhibit saturation of the absorbance measurement.

- describes the absorbance in units of inverse centimeters for Perfluorohexane (example 4) versus wavelength lambda (λ) in units of nanometers. Results below ~149 nm exhibit saturation of the absorbance measurement.

- describes the index of refraction in absolute units for Perfluorohexane (example 4) versus wavelength lambda (λ) in units of nanometers.

Figure 13

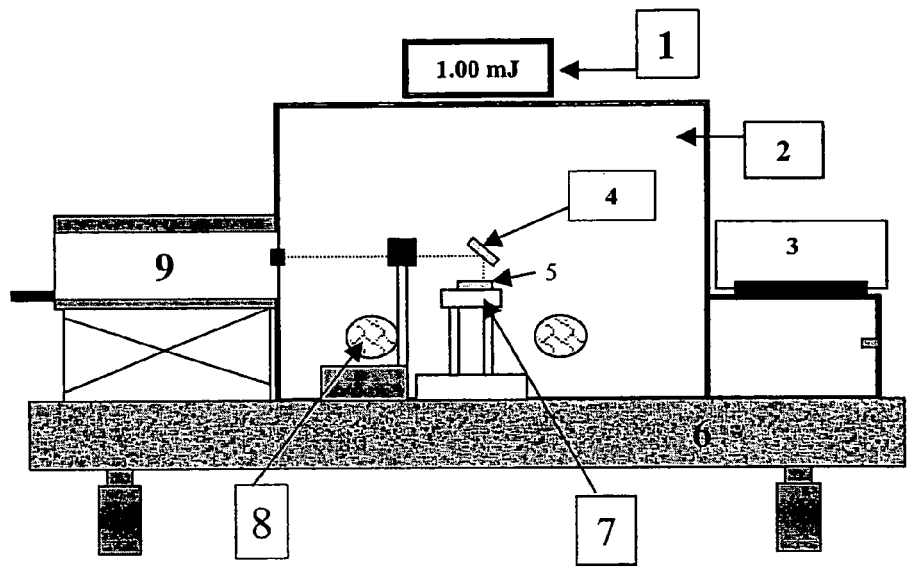

- describes the equipment for immersion contact lithography (example 4). (1) is the Scientech: Vector D200 laser power meter, (2) is the $N_2$ Purged Dry Box, (3) is the Thermox Oxygen Analyzer for the Dry Box, (4) is the 157 nm Dielectric Mirror, (5) Photoresist coated silicon wafer, with photomask contacting its top surface, in petri dish, (6) Newport Air Table, (7) translation stage for sequential exposures, (8) Gloved Access Ports, (9) Lambda Physik Optex 157 nm Excimer Laser.

- describes the optical apparatus for immersion contact lithography (example 4). (1) 157 nm Dielectric Mirror , (2) Photoresist coated silicon wafer in petri dish with photomask contacting its top surface , (3) $N_2$ Purged Dry Box , (4) Scientech PHF25 Power Meter Head , (5) $CaF_2$ Beam Splitter , (6) 157nm Laser Beam at ~ 1mJ/cm$^2$ .

Figure 15

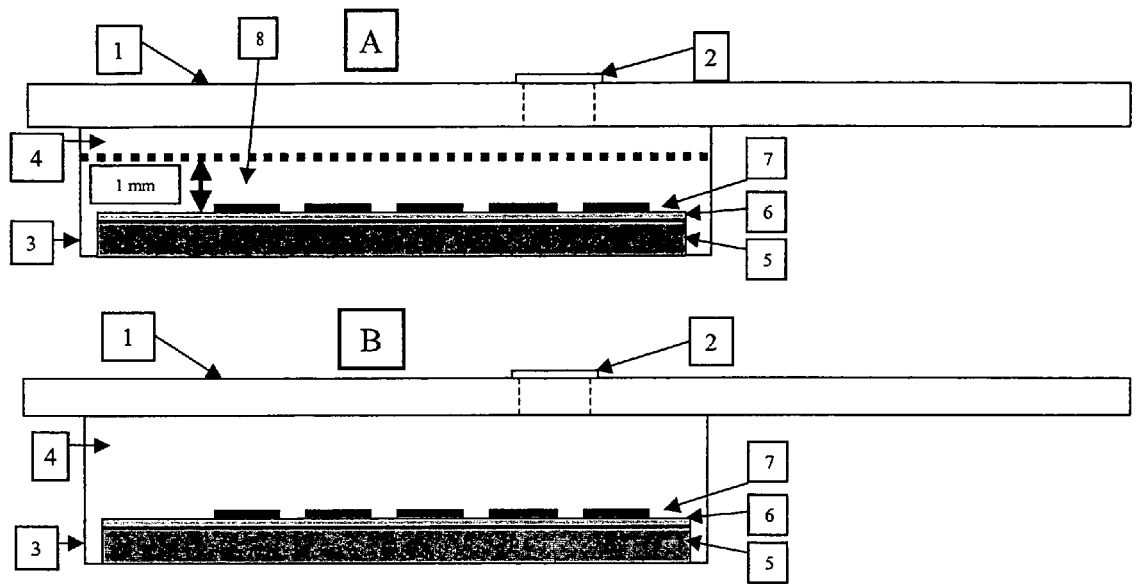

- describes the wafer exposure stage for immersion contact lithography (example 4). A shows the setup for contact immersion lithography with an immersion fluid, while B show the setup for dry contact lithography without the use of an Immersion fluid. (1) Pyrex cover plate, (2) $CaF_2$ Window, (3) Glass Petri Dish, (4) Dry Nitrogen Environment, (5) silicon wafer substrate, (6) photoresist coating, (7) photomasks contacting the photoresist coating, (8) Immersion Fluid filled to 1mm above the wafer, the fluid thickness is not represented to scale.

- shows an optical micrograph of the immersion contact lithography image of the 50 mesh grid photomask printed using Perfluorohexane as the immersion fluid with a 1mm fluid depth (example 4).

shows an optical micrograph of the contact lithography image of the 50 mesh grid photomask printed without using an immersion fluid (example 4).

- describes the absorbance in units of inverse centimeters for Perfluorooctane (comparative example 3) versus wavelength lambda (λ) in units of nanometers for a sample a) loaded in N2 (dot line), b) loaded in N2,dried with 3A molecular sieves (solid line). Results below ~155 nm exhibit saturation of the absorbance measurement.

USE OF PERFLUORO-N-ALKANES IN VACUUM ULTRAVIOLET APPLICATIONS

FIELD OF THE INVENTION

The present invention is drawn to the use of liquid perfluoro-n-alkanes that are highly transparent to UV wavelengths ranging from about 150 nm to 165 nm in optical couplants, optical cements, optical elements, optical inspection media for semiconductor wafers and devices, and immersion photolithography at 157 nm exposure wavelength.

TECHNICAL BACKGROUND OF THE INVENTION

Much progress in the electronics industry comes from circuit size reduction. This is most directly accomplished by running photolithographic processes at ever-shorter wavelengths of light. The electronics industry is currently implementing photolithographic processes employing wavelengths in the so-called "vacuum ultra-violet" (VUV). Processes using 193 nanometer (nm) light are undergoing commercialization while 157 nm wavelength light is under development as a next generation candidate.

One new development in the field is so-called immersion photolithography at 157 nm exposure wavelength as described in Switkes et al, *J. Vac. Sci. Technol. B,* 19 (6), 2353 6, November/December 2001; and, M. Switkes et al, "Resolution enhancement of 157-nm photolithography at 157 nm exposure wavelength by liquid immersion", *Proc. SPIE Vol.* 4691, pp. 459-465 (2002). In immersion photolithography at 157 nm exposure wavelength, the optical source, the target surface, or the entire lithographic apparatus is immersed in a highly transparent high refractive index liquid. Realization of the potential benefits of this technology is dependent upon identifying liquids with exceptionally high transparency in the VUV with excellent photochemical stability, as described, for example, in M. Switkes, R. R. Kunz, M. Rothschild, R. F. Sinta, P. M. Gallagher-Wetmore, and V. J. Krukonis, "Liquids for immersion photolithography at 157 nm exposure wavelength at short wavelengths", *Proc. SPIE Vol.* 5040, 690-699 (2003).

Switkes et al, *Microlithography World*, May 2003, pp. 4ff, further demonstrate that 157 nm light in a high refractive index medium can simulate the effects of much shorter wavelength light for photolithographic purposes.

Considerable emphasis in the art has been placed on identifying organic polymeric compositions suitable for use in the VUV. See for example WO 0185811 and WO 137044, which disclose fluorinated polymeric compositions having high transparency at 157 nm. Considerably less emphasis has been placed upon lower molecular weight organic liquids, which may be employed as an immersion medium in immersion photolithography in which a liquid medium is used between the projection lens of the optical stepper and the photoresist-coated substrate (typically a silicon wafer), which will receive and detect the photolithographic image. Whether polymeric or not, any material residing in the light path between the source and the target needs to be highly transparent and photochemically stable at VUV wavelengths. As disclosed in the references hereinabove cited, suitable liquids can also be used as inspection media for immersion inspection of patterned objects such as semiconductor wafers, wherein the effectively reduced wavelength will produce higher resolution imaging of small size defects.

According to Switkes et al, "Liquids for immersion photolithography at 157 nm exposure wavelength at short wavelengths," op.cit., an immersion liquid layer should desirably be at least 1 mm thick for mechanical reasons and at least 95% transparent for good optical performance. A reasonable estimate of the needed absorbance for an immersion liquid is A/cm=0.22, as determined from the equation $$A/cm \leq [\log_{10}(T_o/T)]/h = [\log_{10}(100\%/95\%)]/0.1 = 0.22$$

Where $T_o$=light intensity in the absence of immersion fluid
T=light intensity with immersion fluid present
h=distance from lens to resist in centimeters In general, of course, the more transparent the better.

All known organic materials absorb to some extent at 157 nm. The issue is whether liquids can be found that are sufficiently transparent to be practical. It is known in the art that short chain hydrocarbons $H(CH_2)_nH$ and short chain fluorocarbons $F(CF_2)_nF$ are relatively transparent compared to their longer-chain homologues. See for example, B. A. Lombos et al, Chemical Physics Letters, 1, 42 (1967); G. Belanger et al, *Chemical Physics Letters,* 3(8), 649(1969); and K. Seki et al, *Phys. Scripta,* 41,167(1990).

E. Albrecht et al, CERN Document Server: Preprints (2002) 1-14, ep/ep-2002-099, 16 Dec. 2002, (URL:http://documents.cern.ch/archive/electronic/cern/preprints/ep/ep-2002-099.pdf.) discloses that gas phase perfluoro-n-alkanes up to perfluorobutane are sufficiently transparent below 160 nm for use as Cherenkov detectors particularly when impurites such as oxygen, water, and hydrocarbons have been removed. However, gases exhibit very low refractive index and therefore are not suitable for use in immersion photolithography at 157 nm exposure wavelength.

Liquids having the high transparency of perfluoro-n-alkane vapors but with higher refractive index, and the requisite photochemical stability for practical use in immersion photolithography at 157 nm exposure wavelength, and other applications, in the VUV are not identified in the art.

SUMMARY OF THE INVENTION

The present invention provides for a process comprising a light source emitting light in the wavelength range from 150 to 165 nm, a surface illuminated over at least a portion thereof by said emitted light, and a liquid disposed between said light source and said surface in such manner that at least a portion of said emitted light illuminating said surface is caused to be transmitted through said liquid, said liquid selected from the group consisting of perfluoro-n-pentane, perfluoro-n-hexane, and a mixture thereof.

The present invention further provides for an apparatus comprising a light source capable of emitting light in the wavelength range from 150 to 165 nm, a surface disposed so that upon activation of said light source said surface will be illuminated by the light emitted from said light source over at least a portion thereof by said emitted light, and a liquid disposed between said light source and said surface in such manner that at least a portion of said emitted light illuminating said surface is caused to be transmitted through said liquid, said liquid selected from the group consisting of perfluoro-n-pentane, perfluoro-n-hexane, and a mixture thereof.

BRIEF DESCRIPTION OF THE DRAWINGS

FIG. 8 shows the absorbance in units of inverse centimeters for Perfluoro-n-hexane (example 1) versus wavelength lambda (λ) in units of nanometers for a sample a) loaded in Air, b) loaded in $N_2$, c) loaded in $N_2$ and shaken with water, and d) loaded in $N_2$, shaken with water and dried with 3A molecular sieves.

FIG. 13 shows the equipment for immersion contact photolithography at 157 nm exposure wavelength (example 4). (1) is the Scientech: Vector D200 laser power meter, (2) is the $N_2$ Purged Dry Box, (3) is the Thermox Oxygen Analyzer for the Dry Box, (4) is the 157 nm Dielectric Mirror, (5) Photoresist coated silicon wafer, with photomask contacting its top surface, in petri dish, (6) Newport Air Table, (7) translation stage for sequential exposures, (8) Gloved Access Ports, (9) Lambda Physik Optex 157 nm Excimer Laser. (example 4)

FIG. 15 shows the wafer exposure stage for immersion contact photolithography at 157 nm exposure wavelength (example 4). A shows the setup for contact immersion photolithography at 157 nm exposure wavelength with an immersion fluid, while B shows the setup for dry contact photolithography at 157 nm exposure wavelength without the use of an Immersion fluid. (1) Pyrex cover plate, (2) $CaF_2$ Window, (3) Glass Petri Dish, (4) Dry Nitrogen Environment, (5) silicon wafer substrate, (6) photoresist coating, (7) photomasks contacting the photoresist coating, (8) Immersion Fluid filled to 1 mm above the wafer; the fluid thickness is not represented to scale.

DETAILED DESCRIPTION OF THE INVENTION

Figure 1:
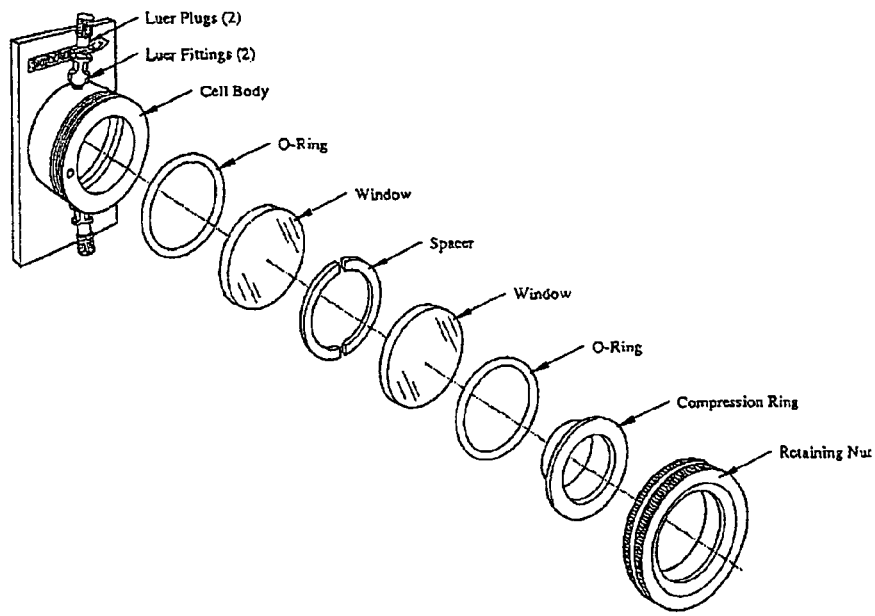
FIG. 1 is a schematic drawing of the Harrick DLC liquid specimen cell, showing the annular spacers, windows and related parts.

According to the present invention perfluoro-n-pentane, perfluoro-n-hexane, or a mixture thereof exhibit surprisingly high suitability for use in imaging applications in the wavelength range of ca. 150-165 nm, particularly 157 nm, as well as other applications requiring high transparency condensed phase optical components such as optical adhesive compositions, solvents for pellicle polymers, index matching fluids and the like. Of particular note are the suitability thereof in the emerging field of immersion photolithography at 157 nm exposure wavelength wherein at least the target surface in a photolithographic apparatus such as is widely employed in the art of microcircuit fabrication is partially or wholly immersed in a liquid of high transparency but higher refractive index than air or other gaseous atmospheres. Perfluoro-n-pentane and perfluoro-n-hexane are liquids under ordinary temperature and pressures and have now been found to exhibit surprisingly high transparency at 157 nm.

For the purposes of the present invention, the linear, unbranched perfluoro-n-pentane, linear, unbranched perfluoro-n-hexane, and mixture thereof will be referred to in the collective as "the perfluoro-n-alkane suitable for use in the present invention" or as "the perfluoro-n-alkane immersion liquid of the invention." The terms "perfluoro-n-pentane" and "perfluoro-n-hexane" refer to the linear, unbranched isomers of perfluoropentane and perfluorohexane according to the usual chemical meaning thereof.

The terms "imaging" and "imaging applications" shall be understood for the purposes of the present invention to mean a process whereby an image is formed on a substrate by a photoactivated process comprising emission of light or radiation from a light source in the wavelength range from 150 to 165 nm, preferably at 157 nm, illumination of a surface over at least a portion thereof by said emitted light, and a liquid disposed between said light source and said surface in such manner that at least a portion of said emitted light illuminating said surface is caused to be transmitted through said liquid, said liquid selected from the group consisting of linear, unbranched perfluoro-n-pentane, linear, unbranched perfluoro-n-hexane, and a mixture thereof. There is no limitation on the shape of the image formed, and may include both a completely masked and a completely unmasked surface. The terms "light" and "radiation" are used herein interchangeably to refer to non-ionizing electromagnetic radiation, particularly in the wavelength range from 150-165 nanometers, most particularly at 157 nm. The present invention does not encompass ionizing radiation.

In the present invention, concentrations where expressed as parts per million (PPM) shall be taken to refer to parts per million by weight on the basis of the total weight of the composition referred to.

In the present invention where the term "heart cut" is used in reference to a distillation, it refers to that portion of the condensate, which results in a fractional distillation when the temperature has reached a plateau.

The term "oxygen-minimized" is employed herein to refer to the atmosphere with which the perfluoro-n-alkane of the invention is to be handled and maintained. The term "oxygen-minimized" is used to indicate that steps are taken to reduce the adventitious contamination of the purified liquid perfluoro-n-alkane by atmospheric oxygen. There is no level of oxygen, which is small enough. The best oxygen-minimized atmosphere is one which contains oxygen below the level of detectability however the invention remains operable at oxygen levels in the atmosphere such that the dissolved oxygen is <10 ppm, preferably <5 ppm, most preferably, <1 ppm.

The present invention provides a process comprising a light source emitting light in the wavelength range from 155 to 160 nm, a surface illuminated over at least a portion thereof by said emitted light, and a liquid disposed between said light source and said surface in such manner that at least a portion of said emitted light illuminating said surface is caused to be transmitted through said liquid, said liquid comprising perfluoro-n-pentane, perfluoro-n-hexane, or a mixture thereof.

Preferably the light source emits light at 157 nm. More preferably the light source is a laser. Most preferably the light source is an $F_2$ excimer laser emitting light at 157 nm.

Preferably the surface is a photoresist surface. More preferably the photoresist surface resides on a silicon wafer. Preferably the illumination is an imagewise exposure of the preferred photoresist surface. Preferably the photoresist surface is immersed in the liquid. Preferably all of said emitted light is employed to illuminate said immersed surface. The preferred embodiment wherein a photoresist surface immersed in said liquid is subject to image-wise exposure by said light source is the preferred immersion photolithography embodiment of the present invention.

The perfluoro-n-alkanes of the present invention have been found to exhibit an absorbance/centimeter <15 at 157 nm, while exhibiting a refractive index in the range of 1.30 to 1.35 at 157 nm making them highly desirable for use in imaging applications in the wavelength range of 150-165 nm, particularly 157 nm.

In a preferred embodiment of the present invention, the perfluoro-n-alkane suitable for use in the present invention are treated to ensure that oxygen concentration does not exceed 10 parts per million by weight (ppm), and water concentration does not exceed 10 ppm. The so-treated perfluoro-n-alkane suitable for use in the present invention exhibits absorbance in the range of 0.1 to 10.$cm^{-1}$ at 157 nm. In a more preferred embodiment of the present invention, the perfluoro-n-alkane suitable for use in the present invention are treated to ensure that oxygen concentration does not exceed 5 parts per million (ppm), and water concentration does not exceed 5 ppm. The so-treated perfluoro-n-alkane suitable for use in the present invention exhibits absorbance in the range of 0.1 to 2 $cm^{-1}$ at 157 nm. In the most preferred embodiment of the present invention, the water concentration does not exceed 5 parts per million, the oxygen concentration does not exceed 1 ppm and the spectroscopic absorption at 157 nm is in the range of 0.1 to 1 $cm^{-1}$.

The perfluoro-n-alkane suitable for use in the present invention is a liquid at room temperature and pressure. It exhibits a highly desirable combination of high transparency, and high refractive index, which is relatively insensitive to temperature and pressure changes. In a preferred embodiment of the present invention, the perfluoro-n-alkane suitable for use in the present invention is employed as a so-called immersion liquid in immersion photolithography at 157 nm. In this embodiment, at least the target photoresist surface in the 157 nm photolithographic imaging system is immersed in the perlluoro-n-alkane immersion liquid of the invention which is characterized by high transparency and high refractive index in order to effect high resolution lithographic imaging.

Perfluoro-n-alkanes, which are gaseous at room temperature and pressure, are known in the art to exhibit very low absorbance but undesirably low refractive index, which is unstable because it is subject to large changes with small changes in pressure. They are also quite inconvenient for practical use, requiring extensive measures for confinement and handling.

Surprisingly it has been found in the present invention that the perfluoro-n-alkane suitable for use in the present invention exhibits an unexpected combination of properties useful in the process of the invention. Namely it is a liquid of high refractive index with absorbance at 157 nm in the range of 0.1 to 10 $cm^{-1}$, preferably in the range of 0.1 to 2 $cm^{-1}$, most preferably in the range of 0.1 to 1 $cm^{-1}$, making it highly suitable for the practice of the present invention. By contrast, higher homologs, while liquid and of high refractive index, exhibit considerably higher absorbance. Thus, perfluoro-n-heptane is much less suitable, and perfluoro-n-octane, even in a purified form, clearly too absorbing for use at 157 nm as shown in Table 1 and Comparative Example 3. Similarly, other isomers of perfluoropentane and perfluorohexane, including branched or cyclic isomers exhibit excessively high absorbance at 157 nm. As shown in Table 1 herein, absorbance at 193 nm (or above) does not predict absorbance at 157 nm.

Perfluoro-n-pentane and perfluoro-n-hexane are available commercially at purities in excess of 99% from, respectively, SynQuest Laboratories, Inc., Alachua, Fla. and the DuPont Company, Wilmington, Del. Prior to the present invention, use of even the highly purified commercial grades of these materials for immersion photolithography at 157 nm exposure wavelength was not contemplated.

It has been found in the practice of the present invention that the inherent low absorbance at 157 nm of the perfluoro-n-alkane of the present invention in its most preferred embodiment cannot be fully realized unless it is purified of both organic and adventitious environmental contamination such as water and oxygen. Oxygen and organic contaminants are found to be more problematical than water partly because the affinity of the perfluoro-n-alkane of the present invention for water is low.

Certain organic impurities such as but not limited to acid fluorides and olefins are orders of magnitude more absorbing than other organic impurities such as perfluoroheptane. So, for example, the perfluoroalkane of the present invention may be contaminated by a percent or two of perfluoroheptane, or an even higher percentage of perfluorobutane, which is quite transparent though of high vapor pressure and low refractive index. On the other hand, with more highly absorbing contaminants such as chlorinated fluorocarbons, olefins, including fluoroolefins, and carbonyls, including fluorocarbonyls it is important that the concentration of contaminant in the perfluoroalkane of the present invention be <0.1% by weight. In particularly severe instances, concentration as low as 0.0001% can be detrimental.

In the practice of the present invention it is found useful to analyze the as received perfluoro-n-pentane or perfluoro-n-hexane by a gas chromatography-mass-spectroscopy (GC-MS) in combination with NMR to determine what organic contaminants are present, and, what purification steps are indicated. From a practical standpoint, it may be a more productive approach to omit the cost-intensive analysis, and simply put all aliquots of the perfluoroalkane of the present invention through the same purification steps. Purification may include fractional distillation, sparging, freeze-thaw cycling, zone refining, and treatment with absorbants such as silica, molecular sieves of various pore sizes, carbon, silica gel, or mixtures thereof.

Perfluoro-n-pentane and perfluoro-n-hexane typically exhibit absorbance/centimeter of <15 at 157 nm in the "as received" condition from commercial suppliers. While marginally suitable for use in the present invention as received, it is preferred to subject the as-received perfluoro-n-alkane to purification to remove oxygen, water, and organic contamination.

Attainment of the very high transparencies characterizing the preferred and most preferred embodiments of the perfluoro-n-alkane of the invention requires not only the removal of highly absorbing organic impurities as described hereinabove, but also the removal of adventitious environmental contaminants such as oxygen and water, most particularly oxygen, and then making strenuous efforts to avoid recontamination. It is found in the practice of the present invention that oxygen, because of its ubiquity, is the most pernicious contaminant because small concentrations in the perfluoro-n-alkane of the invention cause significant degradation of transparency—i.e., increased absorbance at 157 nm.

In the most preferred embodiment of the invention, the perfluoro-n-alkane suitable for use in the invention exhibit absorbance at 157 nm in the range of 0.1 to 1 cm$^{-1}$. It will be appreciated by one of skill in the art that at purity levels required to achieve this result, the most sensitive measurement of contamination is the spectroscopic absorption itself. In other words the best way to tell that the most important impurities have been removed is to measure the absorbance. Absorbance below 1 cm$^{-1}$ is by far the most sensitive available indicator of purity. Prior to the present invention it was not known that such levels of absorbance could be achieved in the perfluoro-n-alkane of the invention.

The most preferred method for preparing the most preferred perfluoro-n-alkane suitable for use in the invention is to first subject the as-received compound, which is generally of a purity greater than 99%, to fractional distillation in the cleanest possible, grease-free distillation apparatus. The heart cut of the distillate thus produced is then mixed in the liquid state with a mixture of absorbants, including for example silica gel, 3A, and 5A zeolite molecular sieves. Activated carbons are less preferred as absorbants. All subsequent handling of the thus purified perfluoro-n-alkane is then performed in an oxygen-minimized, preferably nitrogen, atmosphere. This includes the use thereof in immersion photolithography, which is advisedly performed in an oxygen-minimized, preferably nitrogen, and atmosphere.

The silica and zeolite absorbants are most effective if activated, preferably by heating while purging with a dry gas flow. It is preferable that absorbant activation be done immediately prior to use. Activation can be achieved by heating to about 200 to 500° C. under a flow of dry, pure air, nitrogen, or helium for several hours. Air at 500° C. has the advantage of burning most residual organic contaminants off an absorbant such as a silica or a zeolite. The gas flow can be continued as the system cools down to a temperature in the range of room temperature to 100° C. In an alternative procedure the gas flow is stopped and the system sealed off. In another alternative procedure, the gas flow is stopped and the system evacuated as the absorbant cools to a temperature in the range of room temperature to 100° C. The advantage of stopping the gas flow while the absorbant is at 500° C. is that this minimizes recontamination from any adventitious impurities in the gas as the absorbant cools down.

A preferred method of activating the silica gel and zeolite absorbants is the following. A Hastelloy tube in a clamshell furnace is loaded with absorbant and then heated under an air flow for two hours at 500° C. The air flow is stopped and the Hastelloy tube immediately sealed at both ends. Once the sealed Hastelloy tube has cooled to room temperature, it is transferred to a $N_2$ glove bag where the tube is opened and the absorbant added to a bottle containing perfluoroalkane liquid that is to be purified. Although the ratio of absorbant to liquid can be varied without limit, it has been found satisfactory to employ one volume of absorbant for every two to 20 volumes of liquid.

A key aspect of the distillation process is that it be performed in the cleanest least contaminated still possible. It is particularly important to exclude oxygen and any adventitious or systemic organic contaminants. It is found in the practice of the invention that employment of grease, including fluorinated greases, such as is commonly employed in distillation and vacuum systems to provide improved sealing and easier part removal can contaminate the distillate herein sufficiently to actually degrade the absorbance. It is therefore necessary to perform the distillation in what is herein designated a "grease-free" distillation system.

What "grease-free" means in the context of the present invention is that no grease should be employed when assembling the cleaned parts of the system. One of skill in the art will appreciate that the term "grease-free" does mean that the invention is not operable should there be some small amount of adventitious grease contamination somewhere in the system. To the extent that the system can be cleaned of all such adventitious contamination, the better will be the absorbance, but "grease-free" shall not be taken for the purpose of the present invention to mean the complete absence of grease in no matter how small a concentration.

There is no limitation on the applications of the process of the invention, so long as the general conditions thereof are met: namely it must call for a highly transparent liquid in the wavelength range of 150 to 165 nm. Contemplated applications of the process of the invention include, but not limited to, optical couplants, optical cements, optical elements such as liquid lenses, an index-matching optical inspection medium for semiconductor wafers and devices, and an immersion fluid for 157 nm photolithography at 157 nm exposure wavelength.

In a preferred embodiment, the process of the invention is immersion photolithography at 157 nm comprising use of the perfluoro-n-alkane suitable for use in the present invention. In a more preferred embodiment, the process of the invention the perfluoro-n-alkane is characterized by absorbance of in the range of 0.1 to 5 cm$^{-1}$ at 157 nm. In a still more preferred embodiment the perfluoro-n-alkane is characterized by absorbance of in the range of 0.1 to 2 cm$^{-1}$ at 157 nm. In the most preferred embodiment, the perfluoro-n-alkane is characterized by absorbance in the range of 0.1-1 cm$^{-1}$.

It is found that the compositions of the invention, as received or as synthesized, exhibit an oxygen content generally in the range of 90 ppm. Compositions of the invention, as received or as synthesized, generally contain trace contaminants, possibly including moisture, that can be removed by exposing the fluid to absorbants such as molecular sieves or silica gel. The perfluoro-n-alkanes suitable for the practice of the invention that have been deoxygenated and treated with an absorbant such as molecular sieves are remarkably more transparent.

Methods known in the art for performing extractions of particular types of contaminants are suitable for the practice of the present invention, but care must be taken that these methods are executed under very clean conditions to avoid further contamination, in order to avoid substituting one problem for another.

In the case of moisture any means known in the art for removing moisture is acceptable for the practice of the present invention. Suitable means include purging with a desiccated gas, or under a desiccated purge gas, or both; heating in a recirculating air oven having desiccant beds; refluxing in the presence of a desiccated purge gas, sparging with a purge gas, preferably an inert gas such as nitrogen or argon; contact with a desiccated atmosphere at room temperature or below; contact with a desiccant such as molecular sieves; vaporization of the liquid perfluoro-n-alkane liquid, passage of the vapor over a desiccant such as molecular sieves, followed by condensation (freeze-thaw cycles, usually including a step for evacuation of the closed vessel after recondensation of the vapor); or contact with chemical desiccants such as isocyanates, and fractional distillation. In the case of contact with a desiccant it will normally be necessary to add a separation step upon completion of the extraction step.

Preferred is to perform fractional distillation followed by mixing the heart cut of condensate with a solid absorbant followed by filtration just prior to use, all conducted in a nitrogen or other oxygen-minimized atmosphere. Finely dispersed solid absorbents may be suspended in the perfluoro-n-alkane suitable for use in the invention and then filtered out. Types 3A, 4A, and 5A molecular sieves are preferred because their cavities are of a size that favors the selective absorption of water and other trace contaminants from organic vapors and fluids. Silica gel is also suitable. Most preferably a mixture of absorbants is employed.

There are no limitations on the methods of absorption which may be employed to achieve the desired state of purity provided that the method employed does not introduce more undesirable contamination than it removes, that the method not cause significant degradation of the compound being purified, and that the method be safely executed. Thus, any method known to one of skill in the art for absorbing contaminants from organic liquids is suitable.

Oxygen contamination not only degrades transparency at 157 nm but is also a source of photochemical instability at the high energies of VUV radiation. Oxygen is widely known in the art to be closely associated with degradation reactions in many materials. The technique of sparging with an inert gas, preferably nitrogen or argon, is found to be an effective means for removing oxygen from the compositions of the invention. Other methods suitable for removing oxygen include contacting with an oxygen free purge gas, contacting with an oxygen scavenger, repeated cycles of freezing, pulling a high vacuum and thawing, or vacuum distillation or fractional distillation under an inert gas or combined with purging with an inert gas are all effective means for extracting oxygen from the fluorinated organic compounds suitable for use in the present invention. It is found in the practice of the invention that simply handling and maintaining the perfluoro-n-alkane of the invention in an oxygen-minimized atmosphere can result in considerable reduction in oxygen concentration by virtue of diffusion and Henry's Law. Furthermore, fractional distillation under a nitrogen flow appears to be effective at decreasing oxygen contamination since evolved oxygen will not recondense.

There are no limitations on the methods of extracting oxygen which may be employed to achieve the desired oxygen concentration provided that the method employed not introduce more undesirable contamination than it removes, that the method not cause significant degradation of the compound being purified, and that the method be safely executed. Thus, any method known to one of skill in the art for extracting oxygen from organic liquids is suitable.

Sparging is a suitable method for practicing the process of the invention, particularly for the removal of oxygen. One method for sparging found effective in the practice of the invention is as follows: A glove box is supplied with dry, low-oxygen-content nitrogen such as 99.998% or better nitrogen sold as a cylinder gas by Matheson or by the boil-off of liquid nitrogen. A liquid aliquot of about 10 ml is placed in a 20 ml glass scintillation vial. The sample is transferred into the nitrogen purged dry box. The vial is secured flat on the work surface, the plastic cap is removed from the vial, a disposable glass pipette lowered into the solvent and then nitrogen delivered via the pipette from the same dry, low-oxygen source as the glove box. Flow rate is adjusted to maintain vigorous bubbling of solvent short of causing the solvent to splash out of the vial. Vigorous sparging is continued for 30-60 seconds, long enough to significantly decrease oxygen content and possibly water content without major loss of solvent to evaporation.

An alternative method for purifying the perfluoro-n-alkane suitable for use in the invention is bulb-to-bulb distillation through a bed of 3 A molecular sieves. For example, two flasks are connected by a tube containing 3A molecular sieves preheated as described above. One of the flasks is then partially filled with the fluid that is to be purified, let us say by way of example, perfluoro-n-hexane, and the system resealed. The perfluoro-n-hexane is subjected to three freeze/thaw cycles to remove oxygen dissolved in the perfluoro-n-hexane. The system is then thoroughly evacuated after refreezing the perfluoro-n-hexane with liquid nitrogen. The system is sealed under vacuum and the liquid nitrogen cooling bath transferred from the flask containing the perfluoro-n-hexane to the empty flask. As the perfluoro-n-hexane warms towards room temperature it distills through the bed of 3A molecular sieves to the chilled flask. Once distillation is complete the vacuum is relieved with moisture and oxygen free nitrogen, the perfluoro-n-hexane allowed to warm to room temperature, and the perfluoro-n-hexane flask then valved off for subsequent use.

For the purpose of the present invention, the terms "desiccated" as in "desiccated atmosphere" or "desiccated purge gas" means simply that the atmosphere or purge gas is sufficiently low in moisture content that it can function effectively to extract moisture from the preferred organic liquid of the invention. Preferably, a desiccated purge gas or desiccated atmosphere and the like will have been previously subject to an actual drying step prior to its use for extraction of moisture according to the present invention.

In the practice of the present invention, extraction of any one photochemically active species will be beneficial whether or not any other photochemically active species, which may be present, is extracted. However, the most preferred embodiment of the composition of the invention is not achievable unless oxygen, water, and miscellaneous organic impurities are extracted according to the most preferred process hereof.

The present invention provides for a process comprising a light source emitting light in the wavelength range from 150 to 165 nm, a surface illuminated over at least a portion thereof by said emitted light, and a liquid disposed between said light source and said surface in such manner that at least a portion of said emitted light illuminating said surface is caused to be transmitted through said liquid, said liquid comprising linear, unbranched perfluoro-n-pentane, linear, unbranched perfluoro-n-hexane, or a mixture thereof.

In a preferred embodiment, the perfluoro-n-alkane immersion liquid of the invention is employed in immersion photolithography at 157 nm as described by Switkes et al, op.cit. In this embodiment of the invention at least the photoresist surface target is immersed in the optically transparent, chemically inert, high refractive index perfluoro-n-alkane immersion liquid of the invention. Among the requirements for an immersion liquid that Switkes discusses are that it be transparent enough to allow a working distance of at least 10's of micrometers and that it have high radiation durability at 157 nm. The combination of high transparency and high radiation durability of the perfluoro-n-alkane immersion liquid of the present invention makes it particularly well-suited for immersion photolithography at 157 nm exposure wavelength applications at 157 nm.

Additional requirements for a suitable immersion liquid are that it be chemically and physically compatible with the materials used in the system. In immersion photolithography at 157 nm exposure wavelength, the immersion fluid is in contact with a photoresist polymer. An immersion fluid must not dissolve the photoresist, not interfere with latent image formation in the photoresist under 157 nm exposure, and not interfere with subsequent development of the photoimaged photoresist in a developer solution. In addition the immersion fluid must have a low enough volatility that it does not require a pressure vessel for containment and is easily removed for reprocessing prior to post exposure baking, and development.

According to the present invention, there are three embodiments contemplated within the framework of immersion photolithography at 157 nm exposure wavelength at 157 nm. These are contact, proximity and projection immersion photolithography at 157 nm exposure wavelength. In projection immersion photolithography at 157 nm exposure wavelength, the index of refraction of the fluid can be considered to produce a reduced wavelength of the lithographic light in the immersion fluid, given by $\lambda_{immersion\ fluid} = \lambda_{vacuum} / n_{immersion\ fluid}$ where $\lambda$ is the wavelength in the immersion fluid or vacuum respectively and n is the index of refraction of the immersion fluid. This effective reduction of the optical wavelength in the immersion fluid allows for an improvement in the ultimate resolution that can be printed using immersion photolithography at 157 nm exposure wavelength.

In the case of contact and proximity immersion photolithography at 157 nm exposure wavelength, the wavelength of the lithographic light in the fluid is the same as for projection immersion photolithography at 157 nm exposure wavelength, but the feature sizes printed are dictated by the contact or proximity mask used. In contact or proximity immersion photolithography at 157 nm exposure wavelength the primary purpose of the perfluoro-n-alkane immersion liquid of the invention is to protect the imaged surface, as for example, from particulate or dust contamination from the environment. Additionally contact or proximity immersion photolithography at 157 nm exposure wavelength are useful screening methods for determining the usefulness of a candidate liquid for the more complex and expensive but more preferred projection method.

According to the immersion photolithographic process of the invention, 157 nm radiation from, for example from a $F_2$ excimer laser, is transmitted through a photomask, typically comprising a chrome metal circuit patterned on glass by electron beam imaging, forming an image of the circuit pattern on a photoresist. Numerous materials for use as photoresists are well known in the art and are in widespread commercial use. All such materials are suitable for the practice of the present invention so long as they are functional at 157 nm and are largely insoluble in the immersion fluid. Suitable photoresist compositions are described in *Introduction to Microlithography, Second Edition* by L. F. Thompson, C. G. Willson, and M. J. Bowden, American Chemical Society, Washington, D.C., 1994.

One of skill in the art will appreciate that the source of the 157 nm radiation, or for that matter radiation in the wavelength range of 150-165 nm, is not highly relevant to the practice of the invention. $F_2$ excimer lasers are convenient, controllable, high intensity sources of 157 nm radiation and are therefore preferred.

Figure 14:
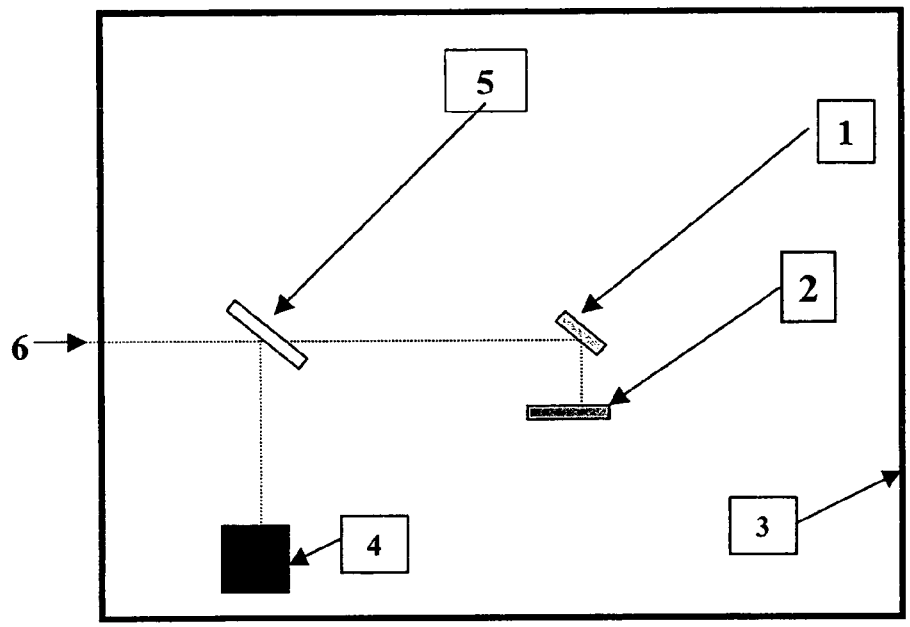
FIG. 14 shows the optical apparatus for immersion contact photolithography at 157 nm exposure wavelength (example 4). (1) 157 nm Dielectric Mirror, (2) Photoresist coated silicon wafer in petri dish with photomask contacting its top surface, (3) $N_2$ Purged Dry Box, (4) Scientech PHF25 Power Meter Head, (5) $CaF_2$ Beam Splitter, (6) 157 nm Laser Beam at ~1 mJ/cm$^2$.

One embodiment of the photolithographic process of the invention is depicted in FIGS. 13-15. FIG. 13 shows a complete system, which is advantageously disposed on an optical table (6) with air support legs to minimize vibrations in the photolithographic exposure chamber. A Scientech power meter (1) is used to read the energy of the 157 nm laser pulses emitted by an F2 excimer laser (9). In the particular embodiment depicted in FIG. 13, the photolithographic exposure chamber is a conventional laboratory nitrogen flushed drybox (2) adapted for use in the apparatus therein depicted. The 157 nm laser light is introduced into the dry box through one of the gloved access ports (8). A Thermox oxygen analyzer (3) is used to monitor the oxygen content in the dry box, and to indicate when oxygen concentration has decreased to acceptable levels after introduction of new samples. Upon introduction into the dry box chamber, the laser beam is reflected downwards by a mirror (4) to the photoresist coated silicon wafer (5). The photoresist coated wafer is immersed to a depth of ca. 1 mm in a perfluoro-n-alkane suitable for use in the present invention contained in a glass dish. The whole dish can be translated under the laser beam to allow sequential exposures of different portions of the wafer, with differing exposure doses.

FIG. 14 shows more details of the optical exposure system of FIG. 13. The pulsed laser beam from the Excimer laser enters the dry box (3) at (6), and is incident on a $CaF_2$ beam splitter (5), that reflects a small portion of the laser energy, down to a power meter head (4), so as to measure the laser's energy per pulse. The majority of the laser beam continues through the beam splitter (5) and is then incident on a dichroic mirror (1), designed for use at a 45° angle of incidence of 157 nm light, such that the laser beam is redirected into the vertical direction, downward towards the photomask covered, photoresist coated silicon wafer (2).

FIG. 15 shows the wafer exposure stage, where the laser beam from the excimer laser, passes through the $CaF_2$ window (2) on the fixed cover plate (1) of the exposure stage. The glass petri dish (3) moves under the glass cover plate using the translation stage (7) of FIG. 13, so as to permit the sequential exposures, at various exposure doses. (4) is the inside of the glove box, (5) is the silicon wafer, which has been coated with a photosensitive photoresist polymer (6) as discussed in more detail below. Depicted in FIG. 15 is an embodiment of the invention known as contact photolithography at 157 nm exposure wavelength wherein a photomask (7) is placed on the surface of the photoresist polymer layer. FIG. 15B depicts the same set-up but without the immersion fluid; FIG. 15B is not an embodiment of the present invention. It is found in the practice of the invention that when the photomask is small and light, as for example the grids used in the specific embodiments herein, it is convenient to introduce the immersion fluid first and then to position the photomasks in the fluid and on the surface of the photoresist coated silicon wafer.

In another embodiment of the present invention, the photomask may be offset from the surface of the photoresist by a distance of ca. 10 µm. In a preferred embodiment of the present invention, in so called projection photolithography at 157 nm exposure wavelength, the photomask is disposed at some convenient location in the optical path, and the image is projected via a lens system, typically known as a projection lens, onto the photoresist. The projection system provides the highest resolution of the various embodiments of the present invention.

In the projection photolithography at 157 nm exposure wavelength method of the invention, the output element of the projection lens—that end of the lens system which is closest to the photoresist surface—is disposed within the perfluoro-n-alkane immersion liquid of the invention at a distance of ca. 0.5-5 mm from the photoresist surface which is immersed in said immersion liquid. This method provides the highly desirable benefit of effectively shortening the wavelength of the incident light, thereby increasing the resolution of the technique over that which can be attained in a gaseous atmosphere such as air or nitrogen.

The thickness of the layer of immersion fluid is determined by the details of the imaging system being developed or used. For example in contact photolithography at 157 nm exposure wavelength a suitable thickness of the perfluoro-n-alkane immersion liquid of the invention is 1 mm. A 1 mm thickness may also be suitable for scanning or stepping the wafer under a projection lens, while maintaining sufficient distance between the output element of the projection lens and the wafer. One of skill in the art will appreciate that as the immersion fluid thickness is increased attenuation of the light will also increase, but tolerances in regard to the mechanics of stepping and scanning may become easier. Thinner immersion liquid layers may permit higher light exposure levels but the tolerances required for achieving scanning and/or stepping the wafer at high speed and with high accuracy may become excessively demanding.

The perfluoro-n-alkane immersion liquid of the present invention presents a highly ideal combination of properties. It is an easily handled, low viscosity liquid. It exhibits desirably low absorbance at 157 nm, in the preferred embodiment, an absorbance of less than 2 cm−1, in the most preferred embodiment, less than 0.2 cm−1 while exhibiting a desirably high refractive index of 1.315. This compares to the much higher absorbance of higher homologs such as highly purified perflouro-n-octane of ca. 54 cm−1 on the one hand, or lower, gaseous homologs such as perfluorobutane, which exhibit very low absorbance, but refractive indices which depend very sensitively upon pressure and temperature, and which are much lower.

The perfluoro-n-alkane immersion liquid of the invention provides a high degree of flexibility in system design, reducing the need to trade-off between the thickness of the immersion layer and mechanical design.

Both positive working photoresists and negative working photoresists are suitable for use in the immersion photolithography process of the invention. A positive working photoresist is defined as a resist where the exposure to light, leads to a change in the dissolution behavior of the polymer, such that after development, the exposed regions of the photoresist dissolve away into the developer. Negative working photoresists, have the opposite tone, and the exposed regions stay, while the unexposed regions will dissolve in the developer. The photoresist, when exposed to light, forms what is called a latent image. In a typical method suitable for use in the process of the invention, a chemically amplified, positive tone, resist, that contains a photoacid generator, or PAG, is employed. The photoresist layer comprising the latent image is then subject to a post exposure bake (PEB) step, whereby the photoacid generator produces photoacid, which then catalytically breaks down the backbone of the photoresist. After this PEB step, the photoresist coated wafer is then put into an aqueous base developer, such as a 0.26 Normal TMAH developer, whereby the exposed regions of the polymer film are developed away, and the patterned photoresist is observed.

In characterizing the behavior of a photoresist used in a photolithographic process, two useful exposure parameters employed in the art are E0 the exposure dose to clear the photoresist from large areas that are not patterned, and E1, which is the dose required to get a patterned area of the photoresist, to produce features of the desired sizes. E0 is sometimes called the clearing dose, for clearing the photoresist, and E1 is the sizing dose, for achieving features of the correct size.

While there is no particular limitation on the thickness of the photoresist layer, in the typical practice of the present invention the photoresist coating will be 150 nm to 200 nm in thickness on a silicon wafer substrate. This thickness is determined by the desired minimum feature sizes to be printed. For the purpose of illustration of this concept, but in no way limiting on the scope of application of the process of the invention, using an aspect ratio of 3-4, a typical value in the semiconductor art, if the desired features are 65 nm in width, the film thickness should be ~195 nm. In general, the thicker the photoresist layer, the better resistance to dry etch processes in subsequent processing of the patterned photoresist layer.

In a complete semiconductor manufacturing process, the photolithographic imaging and development of a photoresist layer, is performed many times in sequence, with a series of photomask patterns, and with various etch and deposition processes done between the sequential photolithographic steps.

The perfluoro-n-alkane suitable for use in the present invention may be employed in any number of ways in addition to as an immersion liquid in photolithography. Applications contemplated herein are those in which the perfluoro-n-alkane suitable for use in the invention is disposed between a 157 nm light source and a target. It may employed neat, as in liquid lenses, index matching fluid, and the like. Or it may be an ingredient of a mixture or a diluent such as a solvent for polymers in spin-coating operations a plasticizer in a polymeric film, or a solvent in an adhesive formulation. In another embodiment, the compositions of the present invention are useful in the optical inspection of patterned or unpatterned objects such as semiconductor wafers, where small size defects of varying optical properties are to be detected. The use of these compositions as immersion fluids for immersion inspection enables both higher resolution imaging in the inspection, and also reduce optical scattering from the topography of the sample, permitting the inspection of, for example deep holes which may have defects such as particulate debris present.

In still further embodiments, the compositions of the present invention are useful in the fabrication of sheets, layers, coatings, and films used in lenses, light guides, antireflective coatings and layers, windows, protective coatings, and glues suitable for use in 157 nm photolithography.

These compositions may also be used as elements in a compound lens designed to reduce chromatic aberrations. Heretofore, only $CaF_2$ and possibly hydroxyl free silica have been viewed as having sufficient transparency at 157 nm to be used in transmissive focusing elements. It is also commonly known (e.g., see R. Kingslake, Academic Press, Inc., 1978, Lens Design Fundamentals, p. 77) that by using a second material of different refractive index and dispersion, an achromatic lens can be created. By using the composition of the present invention in conjunction with $CaF_2$, it is expected that an achromatic lens can be constructed from this and other similar materials described in this application.

The present invention is further described but not limited to the following specific embodiments.

EXAMPLES

Water concentration was determined according to the Karl Fischer method commonly employed in the art. The effect of drying over molecular sieves of the preferred compositions of the invention is indicated in Table 1.

Figure 3:
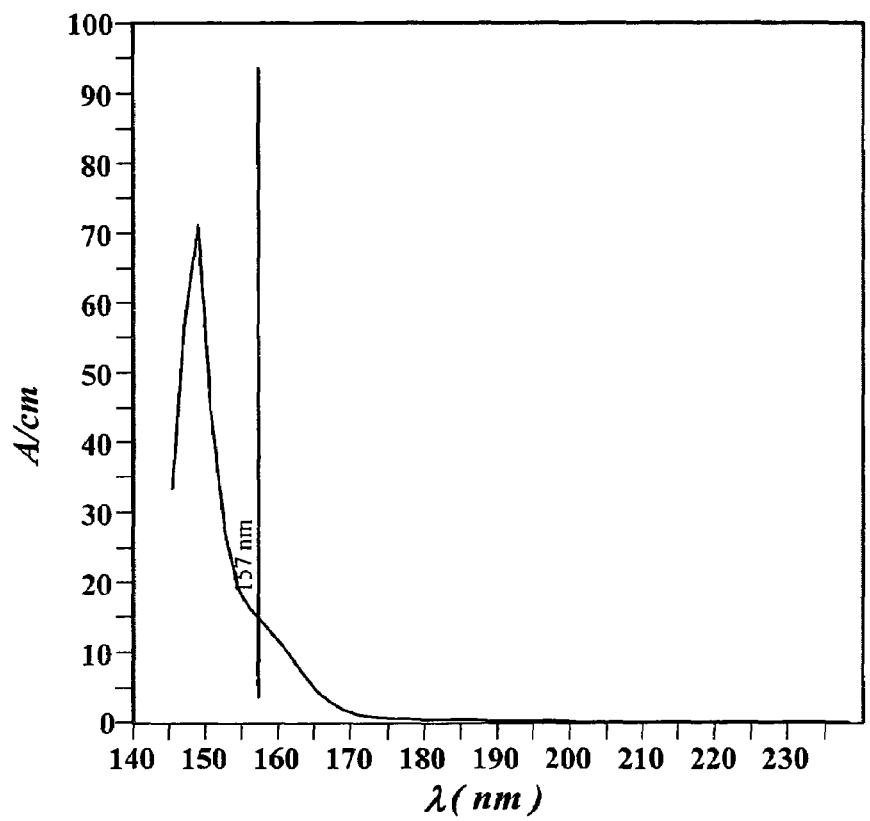
FIG. 3 shows the absorbance in units of inverse centimeters for Perfluoro-2-methylpentane (example C2) versus wavelength lambda (λ) in units of nanometers. Results below ~150 nm exhibit saturation of the absorbance measurement.

The transmission based absorbance measurements of the fluid samples were made using a Harrick Scientific Corp. (Harrick Scientific Corporation 88 Broadway Ossining, N.Y.) Demountable Liquid Cell model DLC-M13 as shown in FIG. 3. The DLC-M13 was mounted in a VUV-Vase model VU-302 spectroscopic ellipsometer, which was capable of performing transmission measurements (J.A. Woollam Co., Inc. Lincoln, Nebr.). The liquid specimen to be tested was held in a cell formed between parallel $CaF_2$ windows by insertion of a Teflon® ring between the windows. Teflon® rings of 6, 25, 100, 500, 920, 2200, 3000, 4000 and 6000 micrometer thicknesses were used, providing multiple optical path lengths through aliquots of the same sample. While charging the cell, care was taken to avoid bubbles in the 8 mm diameter window aperture.

The optical absorbance, A ($cm^{-1}$), per centimeter of specimen thickness as defined in Equation 1, is defined for purposes herein as the base 10 logarithm of the ratio of the transmission of the $CaF_2$ windows at the test wavelength divided by the transmission at that wavelength of the test sample (windows plus experimental specimen) divided by the thickness (t) of the test specimen—in the case of the experiments reported herein, either 6, 25, 100, 500, 920, 2200, 3000 or 4000 micrometers, as discussed hereinabove.

$$A(cm^{-1}) = A/cm = \frac{Log_{10}\lfloor T_{substrate}/T_{sample} \rfloor}{t}. \quad \text{Equation 1}$$

To eliminate the effect of multiple reflections in the case of the liquid samples employed herein, absorbance was determined using the relative change in the transmission of multiple liquid filled Harrick cells with differing cell spacer thicknesses. For example for two different cell thicknesses, the spectral transmission was measured at both cell thicknesses ($t_1$ and $t_2$) and the incremental decrease in transmission ($T_1$ and $T_2$) with the increase in the sample's optical path length provides the optical absorbance/centimeter using Equation 2.

$$A(cm) = A/cm = \frac{\log_{10}(T_1) - \log_{10}(T_2)}{t_2 - t_1}. \quad \text{Equation 2}$$

We generalized this relative transmission method for absorbance determination from multiple optical path lengths in the sample so as to achieve better accuracy in determining the optical absorbance per centimeter of these materials. We used up to 5 different optical path lengths, spanning from 6 to 4400 micrometer cell thicknesses. In this case we measured the transmission $T_n$ (in general) as a function of thickness tn for the cells of various thicknesses.

$$T_1(\lambda) = T_0(\lambda) e^{-\alpha(\lambda) t_1}$$

$$T_2(\lambda) = T_0(\lambda) e^{-\alpha(\lambda) t_2}$$

$$T_3(\lambda) = T_0(\lambda) e^{-\alpha(\lambda) t_3}$$

...

$$T_n(\lambda) = T_0(\lambda) e^{-\alpha(\lambda) t_n}$$

Then taking logarithm of all equations gives $$\ln T_1(\lambda) = \ln T_0(\lambda) - \alpha(\lambda) t_1$$

$$\ln T_2(\lambda) = \ln T_0(\lambda) - \alpha(\lambda) t_2$$

$$\ln T_3(\lambda) = \ln T_0(\lambda) - \alpha(\lambda) t_3$$

...

$$\ln T_n(\lambda) = \ln T_0(\lambda) - \alpha(\lambda) t_n$$

This is a set of N equations for the linear system $y_i = ax_i + b$, where $$y_i = \ln T_i(\lambda), \ a = -\alpha(\lambda), \ b = \ln T_0(\lambda), \text{ and } x_i = t_i.$$

We used linear algebra to simultaneously solve this system of linear equations by a least squares method for the absorbance/centimeter of the samples. The solutions were done both for the case where the errors of measurement for all observations were independent of i, (homoscedastic), the equations were solved by a least-squares method and for the case where the errors of measurement were dependent on i, (heteroscedastic), and the equations were solved by a weighted least-squares method.

As an example for the homoscedastic case the equations we solved are:

$$\frac{\partial}{\partial a} \sum (\ln T_i(\lambda) + \alpha(\lambda) t_i - b(\lambda))^2 = 0$$

$$\frac{\partial}{\partial b} \sum (\ln T_i(\lambda) + \alpha(\lambda) t_i - b(\lambda))^2 = 0$$

And the solutions are:

$$\alpha(\lambda) = \frac{\sum t_i \sum \ln T_i(\lambda) - N \sum t_i \ln T_i(\lambda)}{N \sum t_i^2 - \sum t_i \sum t_i}$$

$$b(\lambda) = \frac{\sum \ln T_i(\lambda) \sum t_i^2 - \sum t_i \ln T_i(\lambda) \sum t_i}{N \sum t_i^2 - \sum t_i \sum t_i}$$

From this analysis of multiple transmission measurements of the material at multiple cell thicknesses we were able to determine the absorbance/centimeter of the material.

Harrick Liquid Cell Procedures

For the purpose of measuring the spectral transmission of fluids as candidates for Immersion Fluids to be used in MicroLithographic Processing, we used a Harrick DLC-M13 demountable liquid cell. The cell had a 8 mm aperture, which included (2) 13 mm diameter×2 mm thick $CaF_2$ windows, o-ring seals, (2) Luer Lock fittings for loading sample, assorted Teflon spacer thicknesses from 6 um to 4000 um. The cell was disassembled for cleaning.

Harrick Cell Cleaning and Assembly Procedure:

Prior to use, and after each sample run, the cell was flushed with Vertrel XF, (as a cleaning solvent), through both Luer Lock fittings using a 1 ml BD glass syringe, then blown dry using clean house nitrogen(which we define as coming from the boil off of liquid nitrogen and typically has less than 3 ppm of water and 5 ppm of oxygen). The (2) $CaF_2$ windows and the selected thickness Teflon spacers were placed into a 20 ml vial containing Vertrel XF, (capped), then put into an ultrasonic bath for, 30-60 seconds. The $CaF_2$ windows and spacers were removed form the cleaning vial, given a final rub with a Q-tip moistened with Vertrel XF then dried with air from a puffer bulb. The cell was then assembled by placing an o-ring into the internal base of the cell, then placing one of the $CaF_2$ windows into the cell, followed by the Teflon spacers, then the second or top $CaF_2$ window, then putting the top o-ring in on the $CaF_2$, place the compression ring onto this assembly then hand tightened the compression nut onto the cell. The complete cleaning and assembly was done in air, in the lab hood.

Loading the Harrick Cell in Air . . . (Lab Hood)

Using a clean, fully assembled cell, approximately 0.5 ml of the sample liquid was transferred from its container using a clean 1 ml BD glass syringe, the syringe was then Luer Locked into the cell and the plunger was gently pushed up to fill the cell. The cell was filled until the liquid meniscus began to exit the top Luer Lock fitting on the cell. No trapped bubbles were permitted to reside in the cell aperture, then the top Luer Lock fitting was capped with the Teflon plug supplied, and the cell was inverted with the syringe still attached. The syringe was twisted off, the thus exposed fitting was capped with another Teflon plug. The sample so prepared was ready for processing.

Loading the Harrick Cell in Nitrogen . . . (Nitrogen Dry Box)

A cleaned, assembled cell, with Teflon plugs (separate, not inserted), a clean 1 ml BD syringe and the selected sample material were placed into the N2 dry box anti-chamber. This chamber was continually purged with house nitrogen until the Oxygen meter on the dry box read 10 ppm O2—approximately 30 minutes. The equipment was then transferred into the dry-box proper.

The sample bottle was opened and approximately 0.5 ml of the sample was transferred from its container using a clean 1 ml BD glass syringe, the syringe was Luer Locked into the cell and the syringe plunger gently pushed up to fill the cell. The cell was filled until the liquid meniscus began to exit the top Luer Lock fitting on the cell. No trapped bubbles were permitted to reside in the cell aperture, then the top Luer Lock fitting was capped with the Teflon plug supplied, and the cell was inverted with the syringe still attached. The syringe was twisted off, the thus exposed fitting was capped with another Teflon plug. The sample so prepared was ready for processing.

Loading a 3A Dried Sample Into the Harrick Cell in Nitrogen . . . (Nitrogen Dry Box)

A cleaned, assembled cell, with Teflon plugs (separate; not inserted), a clean 1 ml BD syringe and the selected sample that had been dried over 3A molecular sieves, still in the sample bottle, were placed in the dry box described above in the manner described.

The sample bottle was opened and the liquid poured into a clean 15 ml BD syringe with a 0.45 micrometer PTFE Luer Lock filter. Using the syringe, the liquid was transferred through the filter into a clean, dry 20 ml vial. Approximately 0.5 ml of the thus filtered sample was transferred into the cell using a clean 1 ml BD glass syringe the plunger of which was gently pushed to fill the cell. The cell was filled and secured as described above.

Absorbance/centimeter Determination

For the purpose of the examples herein below, the absorbance of a material was determined using the relative transmission methods described above, for various cell thicknesses.

As in all experimental measurements, the accuracy of the measured values was a function of the sample and measurement apparatus. The inherent sensitivity of spectral transmission and absorbance measurements was affected by the optical path length of the sample, and the transmission drop that occurred as light passed through the sample in the measurement. As the transmission drop decreased, the accuracy of the absorbance measurement decreased. A transmission difference of ~0.1% was near the limit of the measurement method. In such a case, a thicker sample, with a longer path length, was required to keep the measured transmission drop larger than the instrument's sensitivity.

Index of Refraction Determination

The index of refraction of the material and its temperature coefficient was determined using one of two methods either the minimum deviation prism method on the VUV-vase instrument (see for example John H. Burnett, Rajeev Gupta, and Ulf Griesmann, "Absolute refractive indices and thermal coefficients of $CaF_2$, $SrF_2$, $BaF_2$, and LiF near 157 nm", Appl. Opt. 41, 2508-2513 (2002)) or using the VUV Hilger-Chance Refractometer (see for example John H. Burnett, Simon G. Kaplan, John Fuller, Roger H French, Michael F. Lemon, Measurement of the Index Properties of Fluids for 193 nm and 157 nm Immersion Photolithography at 157 nm exposure wavelength, International Sematech (ISMT) 2004 Immersion Photolithography at 157 nm exposure wavelength Workshop, Los Angeles Calif., 1-27-04.).

157 nm Contact Photolithography at 157 nm Exposure Wavelength

Using the optically transparent compositions of the present invention we demonstrate their ability to lithographically print using Contact Photolithography at 157 nm exposure wavelength at a 157 nm Lithographic wavelength, with and without the presence of an immersion fluid. The procedures for Contact Photolithography at 157 nm exposure wavelength are as follows:

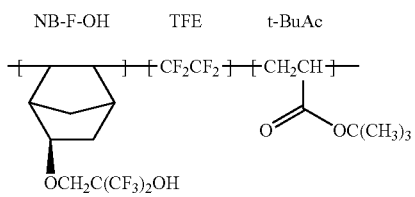

Preparing Silicon Wafers/Photoresist for Lithographic Processing

Four inch diameter Silicon wafers with native oxide were primed with a 0.5 nm thick HMDS coating to enhance uniformity and adhesion of the photoresist film onto the wafer.

A terpolymer of 1) tetrafluoroethylene (TFE), 2) a norbornene fluoroalcohol (NBFOH), and 3) t-butyl acrylate (t-BA) as shown was spin coated onto each Silicon wafer. These polymers were prepared by free radical solution polymerizations using a standard initiator (peroxydicarbonate) and a hydrofluorocarbon solvent, as described in A. E. Feiring, J. Feldman, F. L. Schadt III, K. W. Leffew, F. C. Zumsteg, M. K. Crawford, R. H. French. R. C. Wheland, V. A. Petrov, W. B. Farnham, "Design of Very Transparent Fluoropolymer Resists for Semiconductor Manufacture at 157 nm" Journal of Fluorine Chemistry, 122, 11-16, (2003).

The photoresist used in these examples is formulated with a polymer whose composition is 33% TFE, 43% NBFOH and 24% t-BA, and using standard onium photoacid generators (5 wt % of triphenylsulfonium nonaflate, TPS-Nf, and a base (10 mole % of the PAG loading tetrabutylammonium lactate, TBALac), and a standard solvent (2-heptanone). For details of this resist formulation and processing see M. K. Crawford, W. B. Farnham, A. E. Feiring, J. Feldman, R. H. French, K. W. Leffew, V. A. Petrov, W. Qiu, F. L. Schadt III, H. V. Tran, R. C. Wheland, F. C. Zumsteg, "Single Layer Fluoropolymer Resists for 157 nm Photolithography at 157 nm exposure wavelength", Advances in Resist Technology and Processing XVIII, SPIE Vol. 5039, (2003) and also A. E. Feiring, J. Feldman, F. L. Schadt III, K. W. Leffew, F. C. Zumsteg, M. K. Crawford, R. H. French. R. C. Wheland, V. A. Petrov, W. B. Farnham, "Design of Very Transparent Fluoropolymer Resists for Semiconductor Manufacture at 157 nm" Journal of Fluorine Chemistry, 122, 11-16, (2003). Approximately 1 ml of Terpolymer resist was dispensed onto the wafer, centered on the spin coater chuck, through a 0.45 micron polytetrafluoroethylene syringe filter. The wafer was spun at 2200 rpm for 60 seconds then a Post Apply Bake of the resist was done at 125° C. for 60 seconds. The photoresist films were visually inspected and film thickness of each film measured using a FilMetrics film thickness instrument (San Diego, Calif., 92123). Film thicknesses were typically 2000A±100A. Handling of all samples having unexposed Terpolymer Photoresist was done under yellow lighting.

157 nm Contact Lithographic Exposures

A Lambda-Physik Optex Excimer Laser (Ft. Lauderdale, Fla. 33309) at 157 nm was used to determine the exposure dose necessary to obtain E0, (Open Frame Exposure Dose), and E1, (Printing Exposure Dose with contact mask), in both Dry, (without immersion fluid), and Wet, (immersion fluid). All exposures were undertaken in the nitrogen purged glove box with the oxygen content measured using a Thermox Oxygen Analyzer (AMETEK Process & Analytical Instruments, Pittsburgh, Pa. 15238) on a Newport Optical Table (Newport Corporation, Irvine Calif. 92606). Laser powers were measured using a Scientech D200 Power meter with PHF25 power meter heads (Scientech Inc. Boulder Colo., 80303-1399). The contact photolithography at 157 nm exposure wavelength apparatus is shown in FIGS. 13, 14 and 15.

For contact photolithography at 157 nm exposure wavelength the mask used were SPI Copper TEM Grids (SPI Inc. West Chester Pa., 19380), 3 mm diameter×50 mesh, were placed end to end across the entire wafer in the beam exposure path. The photoresist coated wafer was then exposed in sequential locations across the wafer to increasing exposure doses. After exposure the contact masks were removed from the wafer.

Post Exposure Bake, Development and Characterization

The 157 nm exposure was followed by a Post Exposure Bake, PEB, at 105° C. for 60 seconds. The samples were developed using Shipley LDD-26W Developer (Shipley Company, L.L.C., Marlborough Mass. 01752), by being completely submerged in the developer for 60 seconds at room temperature. Then the sample was submerged in deionized (D.I.) water for 10 to 15 seconds, removed from the water bath, rinsed with D.I. water then blown dry with nitrogen gas. Then the samples were visually and microscopically evaluated for printing performance. The E0 clearing dose was evaluated from regions in which there was not contact mask present, and the E1 Printing dose was evaluated from the regions directly below the contact mask.

TABLE 1

| | | | Absorbance/Centimeter (A/cm) | | | | | | | | |
|---|---|---|---|---|---|---|---|---|---|---|---|
| Ex. # | FIG. # | Material | A/cm 157 nm | A/cm 193 nm | Thick. um | ppm O2 | ppm H2O | As Rec'd | Load in | Shake H2O | Mol. Sieve | Bulb to Bulb |
| C1 | 2 | Hexafluoro propylene Cyclic Dimer | 980 | −1.8 | 6/25 | | | X | Air | | | |
| C1 | 2 | Hexafluoro propylene Cyclic Dimer | >500 | 0.942 | 6/25/100 | | | X | Air | | | |
| C2 | 3 | Perfluoro-2-methylpentane | 16 | 0.16 | 25/100/500 | | | x | $N_2$ | | | |
| C3 | 4 | Perfluorooctane, CF3(CF2)6CF3 | >>100 | 4 | 25/100/500u | | | x | $N_2$ | | | |
| C4 | 5 | Perfluorononane CF3(CF2)7CF3 | >>100 | 30 | 25/100/500 | | | x | $N_2$ | | | |

TABLE 1-continued

Absorbance/Centimeter (A/cm)

| Ex. # | FIG. # | Material | A/cm 157 nm | A/cm 193 nm | Thick. um | ppm O2 | ppm H2O | As Rec'd | Load in | Shake H2O | Mol. Sieve | Bulb to Bulb |
|---|---|---|---|---|---|---|---|---|---|---|---|---|
| C5 | 6 | Perfluoro(1,3-dimethyl cyclohexane) | 329 | 1 | 25/100 | | | X | Air | | | |
| C6 | 7 | Perfluoro-trans-decalin | >1000 | 2 | 25/100 | | | x | Air | | | |
| 1A | 8 | Perfluoro-n-hexane, CF3(CF2)4CF3 | 9.13 | 0.41 | 500/920/2200 | | 5.5 ppm | x | Air | | | |
| 1B | 8 | Perfluoro-n-hexane, CF3(CF2)4CF3 | 1.48 | 0.42 | 500/920/2200 | | 5.5 ppm | x | N₂ | | | |
| 1C | 8 | Perfluoro-n-hexane, CF3(CF2)4CF3 | 3.71 | 0.32 | 500/920/2200 | | 9.1 | | N₂ | X | | |
| 1D | 8 | Perfluoro-n-hexane, CF3(CF2)4CF3 | 1.14 | 0.008 | 500/920/2200 | | <0.1 | | N₂ | X | X | |
| 1E | 8 | Perfluoro-n-hexane, CF3(CF2)4CF3 | 0.70 | 0.27 | 500/920/2200 | | | | N₂ | | | X |
| 2A | 9 | Perfluoro-n-pentane, CF3(CF2)3CF3 | 4.23 | 0.24 | 500/920/2200 | | | x | Air | | | |
| 2B | 9 | Perfluoro-n-pentane, CF3(CF2)3CF3 | 0.97 | 0.21 | 500/920/2200 | | | x | N₂ | | | |
| 2C | 9 | Perfluoro-n-pentane, CF3(CF2)3CF3 | 0.81 | 0.24 | 100/500/920 | | | | N₂ | X | | |
| 2D | 9 | Perfluoro-n-pentane, CF3(CF2)3CF3 | 0.50 | 0.04 | 100/500/920 | | | | N₂ | X | X | |
| 3B | 10 | Perfluoro-n-hexane, CF3(CF2)4CF3 | 0.17 | 0.03 | 500/2200/6000 | | | | N₂ | | X | |
| 4B | 11 | Perfluoro-n-hexane, CF3(CF2)4CF3 | 1.33 | 0.23 | 100/500/1450 | | | | N₂ | | X | |
| C3 | 18 | Perfluorooctane, CF3(CF2)6CF3 | 120.5 | 20 | 25/100/500 | | | | N₂ | | | |
| C3 | 18 | Perfluorooctane, CF3(CF2)6CF3 | 59.3 | 0.16 | 25/100/500 | | | | N₂ | | X | |

TABLE 2

Index of Refraction and Temperature Coefficient of the Index at Lithographic Wavelengths.

| Example | FIG. | Immersion Fluid | Property | Temperature | 157 nm | 193 nm | 248 nm |
|---|---|---|---|---|---|---|---|
| 4C | 12 | Perfluoro-n-hexane, CF3(CF2)4CF3 | Index of Refraction | 31° C. | 1.312 | 1.279 | 1.262 |
| 4C | | Perfluoro-n-hexane, CF3(CF2)4CF3 | Index of Refraction | 21.5° C. | $1.315,62 +/- 1 \times 10^{-4}$ | | |
| 4C | | Perfluoro-n-hexane, CF3(CF2)4CF3 | dn/dT | 21.5° C. | $-5.83 \times 10^{-4}/°C.$ | | |

TABLE 3

Results of Contact Photolithography at 157 nm exposure wavelength With and Without The Use Of Immersion Fluids

| Example | FIG. | Immersion Fluid | Fluid Path Length (mm) | $E_0$ Dose (mJ/cm²) | $E_1$ Dose (mJ/cm²) |
|---|---|---|---|---|---|
| 4 | 16 | Perfluoro-n-hexane, CF3(CF2)4CF3 | 1 | 14 | 20 |
| 4 | 17 | None | 0 | 10 | 12 |

Comparative Example 1

Hexafluoropropylene cyclic dimer was obtained from DuPont as Vertrel® 245.

Figure 2:
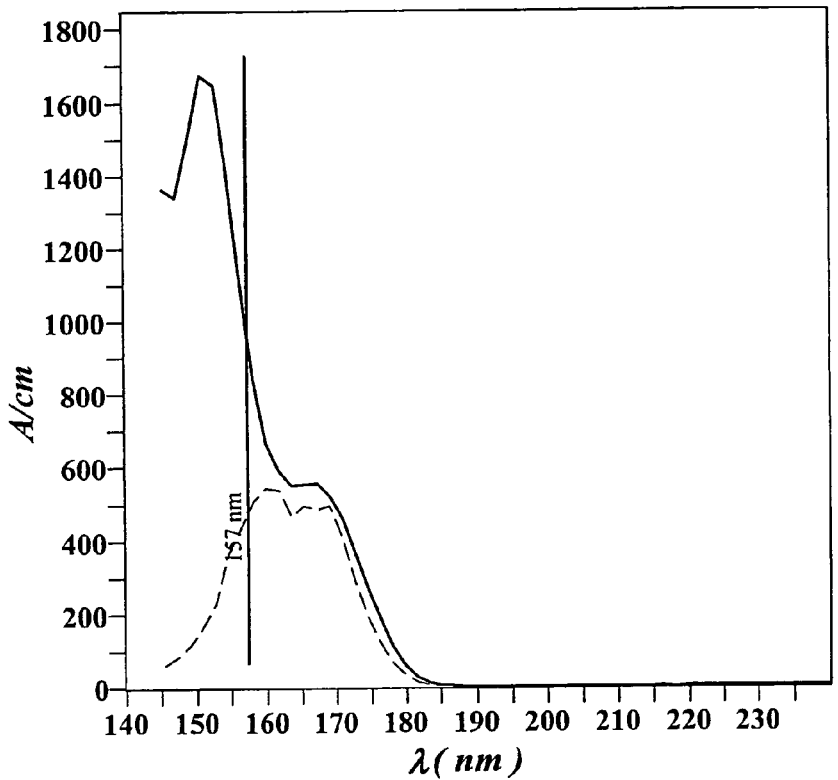
FIG. 2 shows the absorbance in units of inverse centimeters for Hexafluoropropylene Cyclic Dimer (example C1) versus wavelength lambda (λ) in units of nanometers. Results below ~160 nm (dashed line) and ~150 (solid line) exhibit saturation of the absorbance measurement.

The absorbance/centimeter of the sample was determined using the relative transmission method with cell thicknesses of 6/25 micrometers, using the methods discussed above. The sample was as received, which was loaded in air. The optical absorbance per centimeter at 157 nm was 980/cm, and the optical absorbance per centimeter at 193 nm was −1.9/cm. The results are shown in FIG. 2 and summarized in Table 1.

The absorbance/centimeter of the second sample was determined using the relative transmission method with cell thicknesses of 6/25/100 micrometers, using the methods discussed above. The sample was as received, which was loaded in air. The optical absorbance per centimeter 15 at 157 nm was >500/cm, and the optical absorbance per centimeter at 193 nm was 0.942/cm. The results are shown in FIG. 2 and summarized in Table 1.

Comparative Example 2

Perfluoro-2-methylpentane was purchased from SynQuest Laboratories, Inc., Alachua, Fla. (Perfluoro-2-methylpentane, 99% min., catalog #1100-2-10).

The absorbance/centimeter of the sample was determined using the relative transmission method with cell thicknesses of 25/100/500 micrometers, using the methods discussed above. The sample was as received, which was loaded in a nitrogen environment. The optical absorbance per centimeter at 157 nm was 16/cm, and the optical absorbance per centimeter at 193 nm was 0.16/cm. The results are shown in FIG. 3 and summarized in Table 1.

Comparative Example 3

Perfluorooctane was purchased from SynQuest Laboratories, Inc., Alachua, Fla. (Octadecafluoro-n-octane, 99% min., catalog #1100-2-14).

Figure 4:
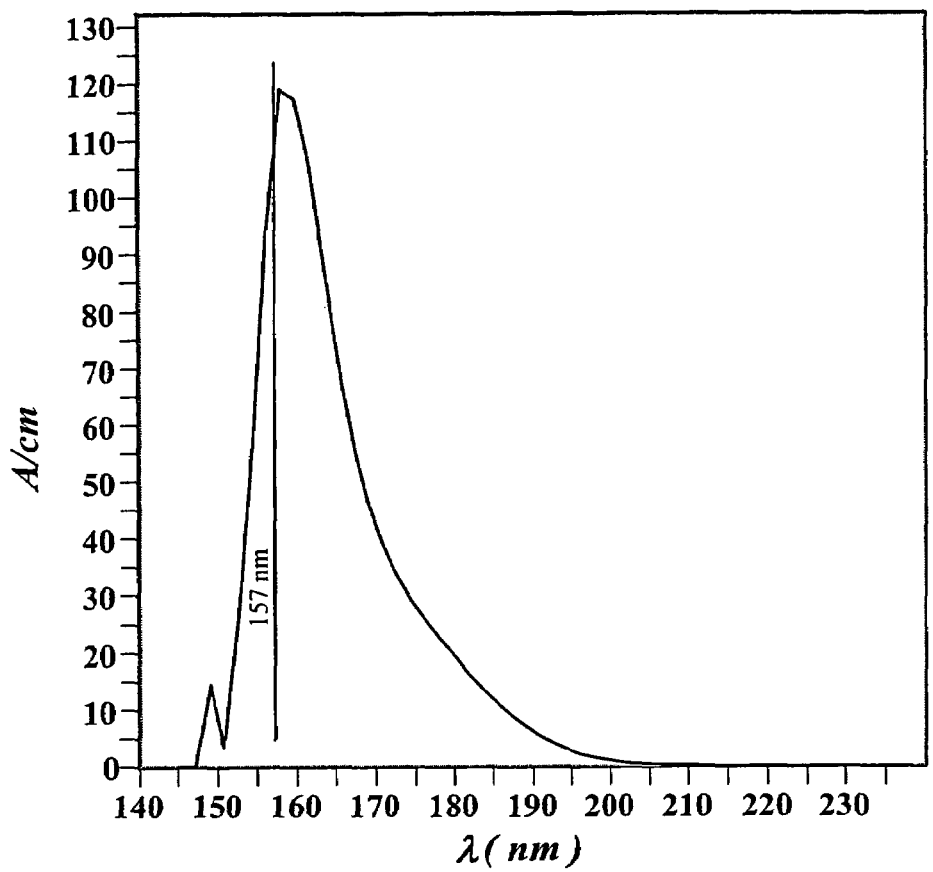
FIG. 4 shows the absorbance in units of inverse centimeters for Perfluorooctane (example C3) versus wavelength lambda (λ) in units of nanometers. Results below ~160 nm exhibit saturation of the absorbance measurement.

The absorbance/centimeter of the sample was determined using the relative transmission method with cell thicknesses of 25/100/500 micrometers, using the methods discussed above. The sample was as received, which was loaded in a nitrogen environment. The optical absorbance per centimeter at 157 nm was >>100/cm, and the optical absorbance per centimeter at 193 nm was 4/cm. The results are shown in FIG. 4 and summarized in Table 1.

Perfluorooctane was distilled through a grease-free stainless steel packed column until the purity of the perfluorooctane was brought up to 99.83% as measured by FID GC.

A small sample of 3A molecular sieves in a Hastelloy™ tube was heated to 300 to 350° C. overnight under an N2 flow. The gas was stopped and then the Hastelloy™ tube sealed at both ends and allowed to cool to room temperature. The sealed Hastelloy™ tube was transferred to a nitrogen glove bag. One end of the Hastelloy™ tube was unsealed and about 7 ml of dried sieves transferred to a vial (VWR TraceClean™ vial with a Teflon™ cap liner) containing ~15 ml of the 99.83% pure perfluorooctane prepared above.

Figure 18:
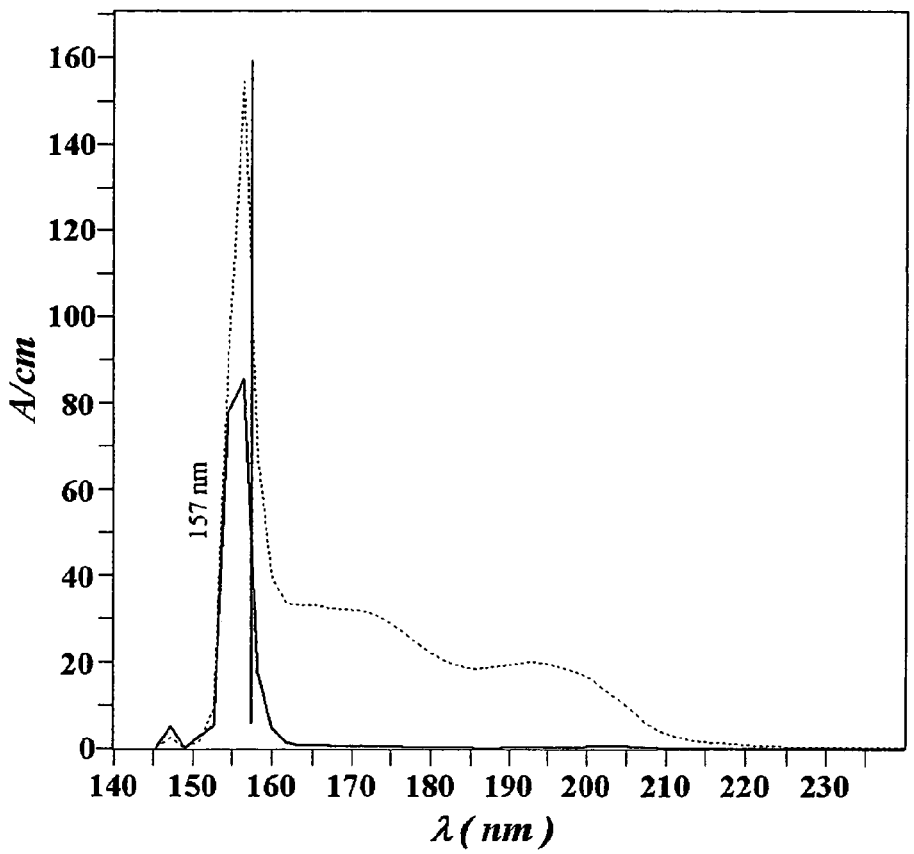
FIG. 18 shows · the absorbance in units of inverse centimeters for Perfluorooctane (Comparative Example 3) versus wavelength lambda (l) in units of nanometers for a sample a) loaded in N2 (dot line), b) loaded in N2,dried with 3A molecular sieves (solid line). Results below ~155 nm exhibit saturation of the absorbance measurement.

The absorbance/centimeter of the 99.83% pure perfluorooctane treated with 3A molecular sieves was determined using the relative transmission method with cell thicknesses of 25/100/500 micrometers, using the methods discussed above. The sample was exposed to 3A molecular sieves and was loaded in a nitrogen environment. The optical absorbance per centimeter at 157 nm was 59.3/cm, and the optical absorbance per centimeter at 193 nm was 0.16/cm. The results are shown in FIG. 18 and summarized in Table 1. This material is useful for immersion photolithography at 157 nm exposure wavelength at 193 nm.

For comparison purposes the absorbance/centimeter of the 99.83% pure perfluorooctane was also determined before its treatment with 3A molecular sieves. Relative transmissions were measured using cell thicknesses of 100/500/1450 micrometers. The sample was loaded in a nitrogen environment. The optical absorbance per centimeter at 157 nm was 120.5, and the optical absorbance per centimeter at 193 nm was 20.0. The results are shown in FIG. 18. Since pure water has no significant absorbance at 193 nm, the decrease in 193 nm absorbance that occurs on treatment with 3A molecular sieves reflects in this case the chemical absorption of impurities other than water.

Comparative Example 4

Perfluorononane was purchased from SynQuest Laboratories, Inc., Alachua, Fla. (Perfluorononane, 99% min., catalog 1100-2-18)

Figure 5:
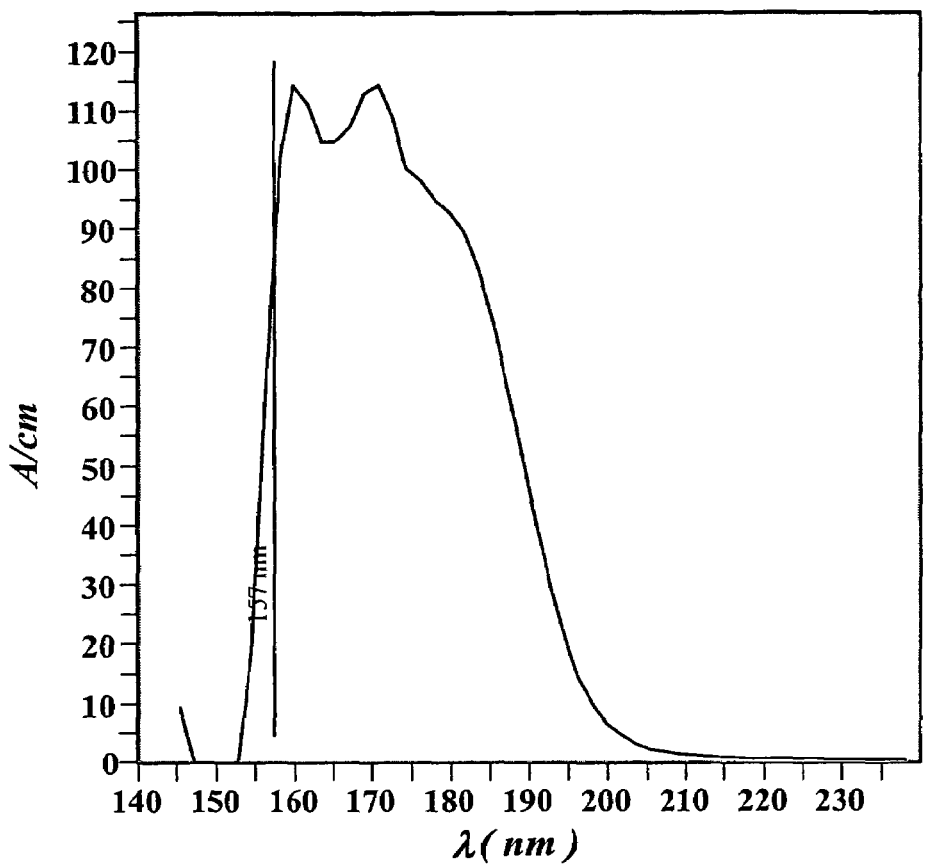
FIG. 5 shows the absorbance in units of inverse centimeters for Perfluorononane (example C4) versus wavelength lambda (λ) in units of nanometers. Results below ~180 nm exhibit saturation of the absorbance measurement.

The absorbance/centimeter of the sample was determined using the relative transmission method with cell thicknesses of 25/100/500 micrometers, using the methods discussed above. The sample was as received, which was loaded in a nitrogen environment. The optical absorbance per centimeter at 157 nm was >>100/cm, and the optical absorbance per centimeter at 193 nm was 4/cm. The results are shown in FIG. 5 and summarized in Table 1.

Comparative Example 5

Perfluoro(1,3-dimethylcyclohexane) was purchased from SynQuest Laboratories, Inc., Alachua, Fla. (Perfluoro-1,3-dimethylcyclohexane, 98% min., catalog 1200-2-07).

Figure 6:
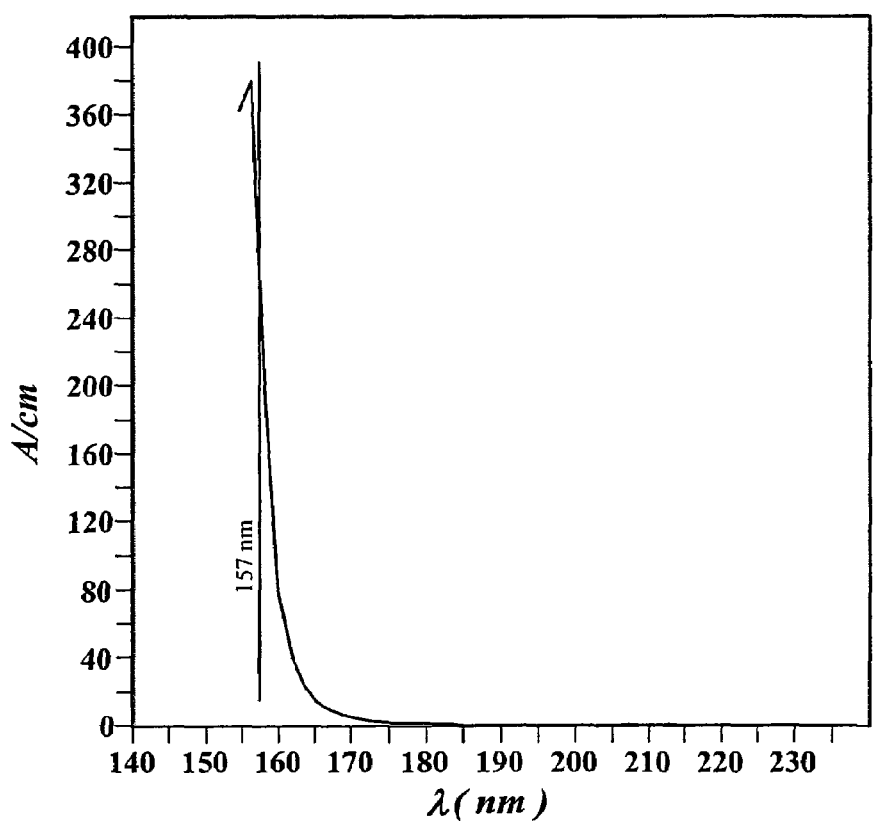
FIG. 6 shows the absorbance in units of inverse centimeters for Perfluoro(1,3-dimethylcyclohexane) (example C5) versus wavelength lambda (λ) in units of nanometers.

The absorbance/centimeter of the sample was determined using the relative transmission method with cell thicknesses of 25/100 micrometers, using the methods discussed above. The sample was as received, which was loaded in air. The optical absorbance per centimeter at 157 nm was 329/cm, and the optical absorbance per centimeter at 193 nm was 1/cm. The results are shown in FIG. 6 and summarized in Table 1.

Comparative Example 6

Perfluoro-trans-decalin was purchased from Aldrich, Milwaukee, Wis. (trans-Perfluorodecalin, 98%, catalog #42,268-1).

Figure 7:
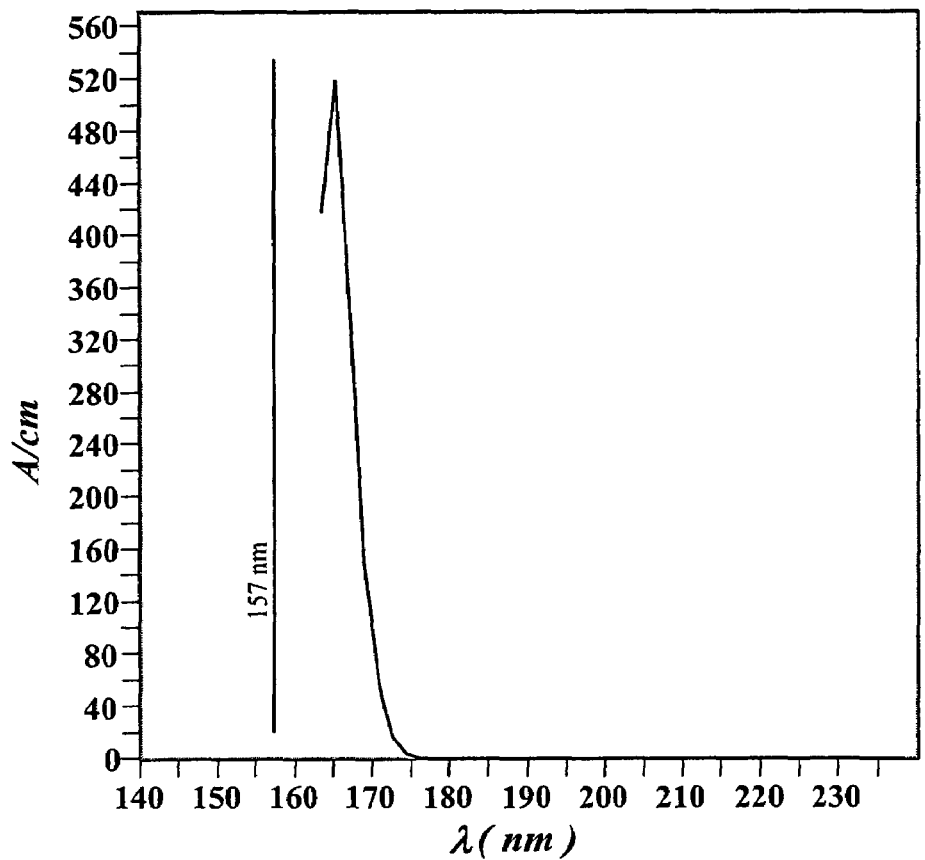
FIG. 7 shows the absorbance in units of inverse centimeters for Perfluoro-trans-decalin (example C6) versus wavelength lambda (λ) in units of nanometers. Results below ~165 nm exhibit saturation of the absorbance measurement.

The absorbance/centimeter of the sample was determined using the relative transmission method with cell thicknesses of 25/100 micrometers, using the methods discussed above. The sample was as received, which was loaded in air. The optical absorbance per centimeter at 157 nm was >1000/cm, and the optical absorbance per centimeter at 193 nm was 2/cm. The results are shown in FIG. 7 and summarized in Table 1.

Example 1

Example 1A

The absorbance/centimeter of the perfluoro-n-hexane sample was determined using the relative transmission method with cell thicknesses of 500/920/2200 micrometers, using the methods discussed above. The sample was as received, which was loaded in air. The optical absorbance per centimeter at 157 nm was 9.13/cm, and the optical absorbance per centimeter at 193 nm was 0.41/cm. The results are shown in FIG. 8 and summarized in Table 1.

Example 1B

The absorbance/centimeter of the perfluoro-n-hexane of Example 1A was determined following the same procedures as in Example 1A with the exception that the samples were handled in a nitrogen rather than an air atmosphere. The optical absorbance per centimeter at 157 nm was 1.48/cm, and the optical absorbance per centimeter at 193 nm was 0.42/cm. The results are shown in FIG. 8 and summarized in Table 1.

Example 1C

The absorbance/centimeter of the perfluoro-n-hexane of Example 1A was determined using the method of Example 1B except that prior to measurement, the perfluoro-n-hexane sample was shaken with water and was loaded in a nitrogen environment. The optical absorbance per centimeter at 157 nm was 3.71/cm, and the optical absorbance per centimeter at 193 nm was 0.32/cm. The results are shown in FIG. 8 and summarized in Table 1.

Example 1D

The absorbance/centimeter of the perfluoro-n-hexane of Example 1A was determined using the method Example 1B except that the sample was shaken with water, exposed to 3A molecular sieves and was loaded in a nitrogen environment. The optical absorbance per centimeter at 157 nm was 1.14/cm, and the optical absorbance per centimeter at 193 nm was 0.008/cm. The results are shown in FIG. 8 and summarized in Table 1.

Example 1E

The perfluoro-n-hexane of Example 1A was purified by bulb to bulb distillation. Clean, grease-free glassware was used. Seals were made using grease-free Viton™ o-rings positioned so that liquid phase fluid never comes in contact with the o-rings. A quartz tube 1" in diameter by 22" long was packed with an inch of stainless steel turnings. These turnings were located about 6" from the bottom end of the tube and were packed tight enough to provide support for a 6" high bed of 3A molecular sieves. A 100 ml flask, equipped with a vacuum stopcock side arm adapter to N2/air/vacuum lines, was attached to the bottom end of the quartz tube.

The quartz tube was then placed in a furnace so that the 6" column of molecular sieves ended up entirely in a 12" long heater zone. A flow of air was started through the furnace and the molecular sieves were heated to 500° C. for 2 hours. The air flow was changed for a nitrogen flow that had been passed through a liquid N2 trap and the furnace cooled to 100° C. The nitrogen flow was stopped, a 100 ml flask connected to the top end of the quartz tube via a detachable vacuum stopcock, and pump vacuum applied to the whole system while the flask and stopcock at the top of the quartz tube were heated with a forced air gun. The apparatus was then allowed to cool to room temperature under vacuum. The vacuum was relieved and 50 ml of perfluoro-n-hexane added to the flask at the bottom of the quartz tube. The system was resealed and the perfluoro-n-hexane frozen by application of a liquid nitrogen bath. Pump vacuum was pulled and system sealed off under vacuum. The perfluoro-n-hexane was then allowed to thaw so that dissolved oxygen could escape into the surrounding vacuum. The perfluoro-n-hexane was refrozen and high vacuum reapplied, removing evolved oxygen from the system. This freeze thaw cycle was repeated another two times.

After the end of the third such freeze-thaw cycle, the perfluoro-n-hexane was refrozen and a fresh vacuum pulled. The system was sealed off under vacuum and the liquid nitrogen cooling bath transferred from the flask containing the perfluoro-n-hexane to the empty flask at the top of the quartz tube. As the perfluoro-n-hexane warmed towards room temperature, it distilled under its own vapor pressure through the bed of 3A molecular sieves (absorbing water) and condensed relatively dry and oxygen free in the liquid nitrogen chilled flask at the top of the quartz tube.

Once distillation was complete, the receiving flask was allowed to warm to room temperature, the system back filled with pure nitrogen, the valve at the top of the receiving flask closed off, and the flask disconnected from the system. The flask was then transferred to a glove box with pure nitrogen atmosphere where the flask was opened and absorption measurements carried out.

The absorbance/centimeter of the sample was determined using the following the method of Example 1 B The sample was underwent bulb to bulb distillation and was loaded in a nitrogen environment. The optical absorbance per centimeter at 157 nm was 0.70/cm, and the optical absorbance per centimeter at 193 nm was 0.27/cm. The results are shown in FIG. 8 and summarized in Table 1.

Example 2

Example 2A

Perfluoro-n-pentane was purchased from SynQuest Laboratories, Inc., Alachua, Fla. (Dodecafluoro-n-pentane, 99% min., catalog 1100-2-05)

Figure 9:
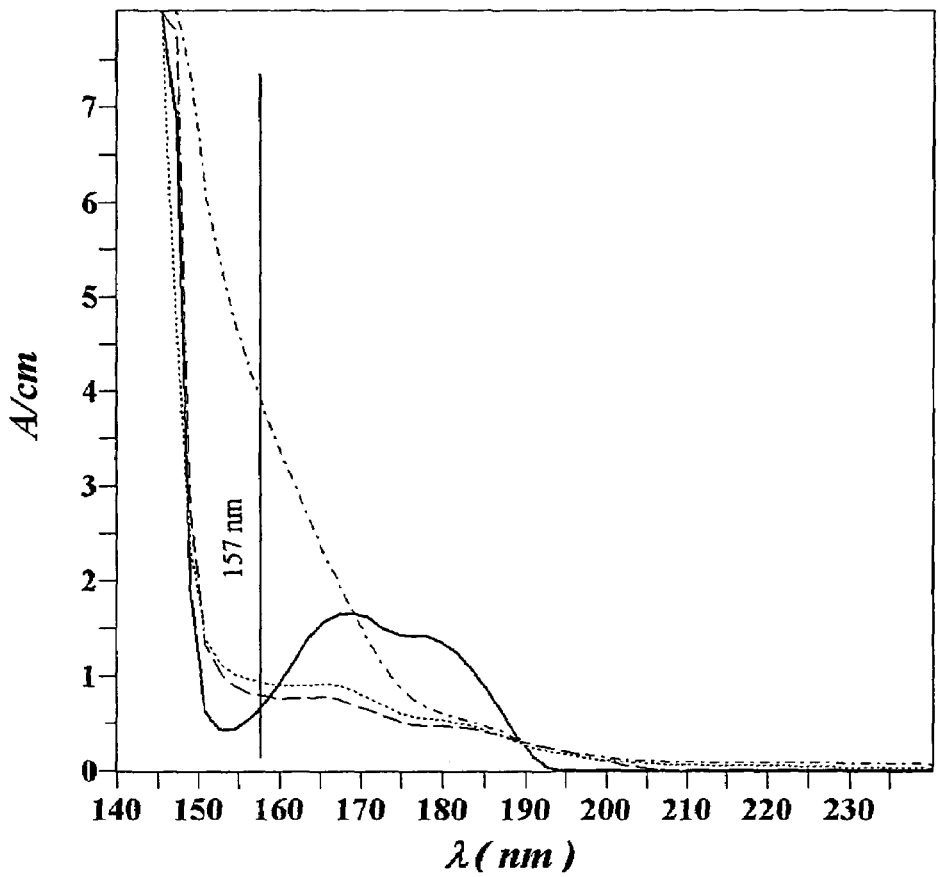
FIG. 9 shows the absorbance in units of inverse centimeters for Perfluoro-n-pentane (example 2) versus wavelength lambda (λ) in units of nanometers for a sample a) loaded in Air (dash dot line), b) loaded in N2 (dotted line), c) loaded in N2 and shaken with water (dashed line), and d) loaded in N2, shaken with water and dried with 3A molecular sieves (solid line).

The absorbance/centimeter of the sample was determined using the method Example 1A. The sample was as received and was loaded in air. The optical absorbance per centimeter at 157 nm was 4.23/cm, and the optical absorbance per centimeter at 193 nm was 0.24/cm. The results are shown in FIG. 9 and summarized in Table 1.

Example 2B

The absorbance/centimeter of the sample was determined using the method of Example 1B The sample was as received and was loaded in a nitrogen environment. The optical absorbance per centimeter at 157 nm was 0.97/cm, and the optical absorbance per centimeter at 193 nm was 0.21/cm. The results are shown in FIG. 9 and summarized in Table 1.

Example 2C

The absorbance/centimeter of the sample was determined using the method of Example 1C. The sample was shaken with water, and was loaded in a nitrogen environment. The optical absorbance per centimeter at 157 nm was 0.81/cm, and the optical absorbance per centimeter at 193 nm was 0.24/cm. The results are shown in FIG. 9 and summarized in Table 1.

Example 2D

The absorbance/centimeter of the sample was determined using the method of Example 1D. The sample was shaken with water, exposed to 3A molecular sieves and was loaded in a nitrogen environment. The optical absorbance per centimeter at 157 nm was 0.50/cm, and the optical absorbance per centimeter at 193 nm was 0.04/cm. The results are shown in FIG. 9 and summarized in Table 1.

Example 3

Example 3A

Preparation of Perfluoro-n-hexane Sample

A 10 gallon sample of perfluoro-n-hexane (DuPont Zonyl™ PFH) was distilled through a 45 foot tall stainless steel column packed with ¼" stainless steel ProPak™ under 3.8 psi (18.5 psia) of helium over the course of several days. Product was collected in stainless steel cylinders. Sixty-three cuts were taken. Cuts #61-63, bp 63.2° C. under 3.8 psi (18.5 psia) helium, were combined giving a total sample weight of 10.7 lbs. GC/MS analysis using a 105 meter capillary column [0.32 mm i.d. coated with a 3 micron film of RTX-1 (Restek DB-1 column)] found 99.99922% perfluoro-n-hexane and 0.00078% perfluoro-n-pentane (area percents from a flame ionization detector). Combined cuts #61-63 were found to exhibit absorption of A/cm of 1.29 at 157 nm when measured under nitrogen. The combined cuts #61-63 were then redistilled using an all new 6' tall, vacuum jacketed glass column packed with ⅛" ProPak. This distillation was done under a positive pressure of helium (~14.7 psia). No grease of any sort was used in the assembly of this apparatus.

Teflon™ sleeves were used at the joints. Thirteen cuts were taken, product being collected in VWR TraceClean™ bottles with 0.0125" Teflon™/silicone cap liners. Fraction #13, bp=57.6° C., weighed 229 grams, and analyzed 99.99957% perfluoro-n-hexane by GC/MS.

A small sample of 3A molecular sieves in a Hastelloy™ tube was heated to 500° C. for 2 hours under an air flow. The air flow was stopped and then the Hastelloy™ tube was sealed at both ends and allowed to cool to room temperature. The sealed Hastelloy™ tube was transferred to a nitrogen glove bag. One end of the Hastelloy™ tube was unsealed and about 7 ml of the dried 3A sieves transferred to a vial (VWR TraceClean™ vial with a Teflon™ cap liner) containing about 15 ml of the 99.99957% pure perfluoro-n-hexane prepared above.

Example 3B

Transparency Results for 99.99957% Pure Perfluoro-n-hexane

Figure 10:
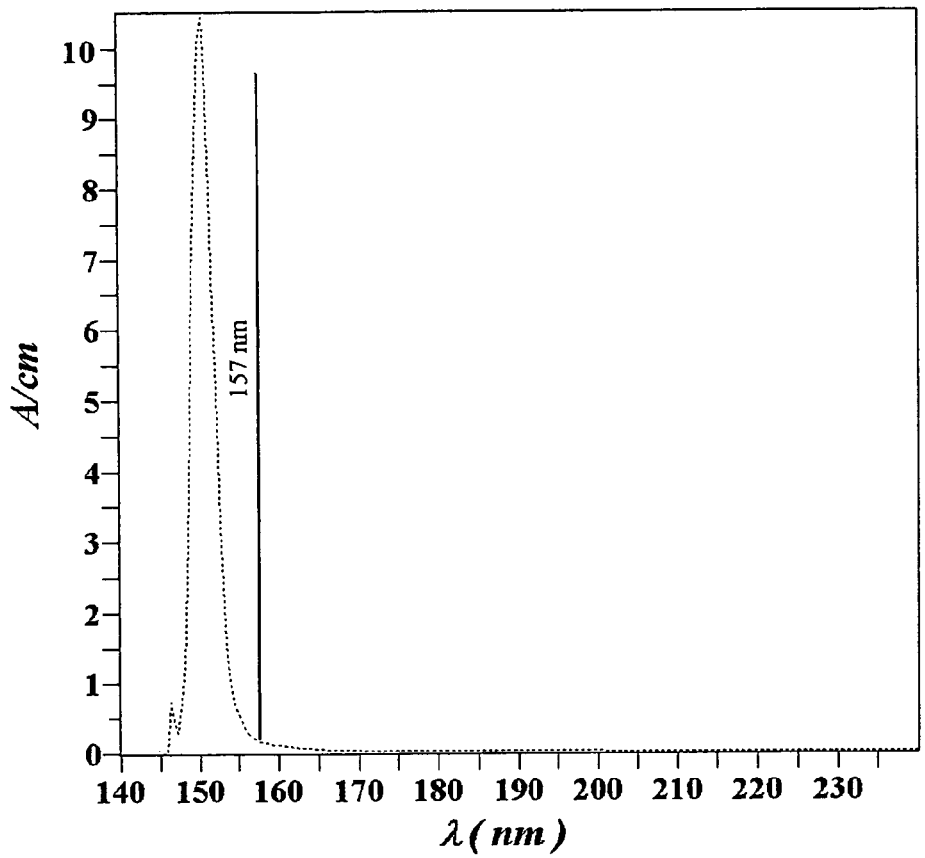
FIG. 10 shows the absorbance in units of inverse centimeters for Perfluoro-n-hexane (example 3) versus wavelength lambda (λ) in units of nanometers. Results below ~150 nm exhibit saturation of the absorbance measurement.

The absorbance/centimeter of the sample was determined using the relative transmission method with cell thicknesses of 500/2200/6000 micrometers, using the methods discussed above. The sample exposed to 3A molecular sieves above was loaded in a nitrogen environment. The optical absorbance per centimeter at 157 nm was 0.17/cm, and the optical absorbance per centimeter at 193 nm was 0.03/cm. The results are shown in FIG. 10 and summarized in Table 1.

Example 4

Perfluoro-n-hexane, CF3(CF2)4CF3

Perfluoro-n-hexane (DuPont Zonyl™ PFH) was distilled through a grease-free stainless steel packed column until the purity of the perfluoro-n-hexane was brought up to 99.69% as measured by FID GC.

3A molecular sieves were activated by heating overnight at 500° C. in air. These activated molecular sieves were added to about 4× their volume of the 99.69% pure perfluoro-n-hexane.

Example 4B

Figure 11:
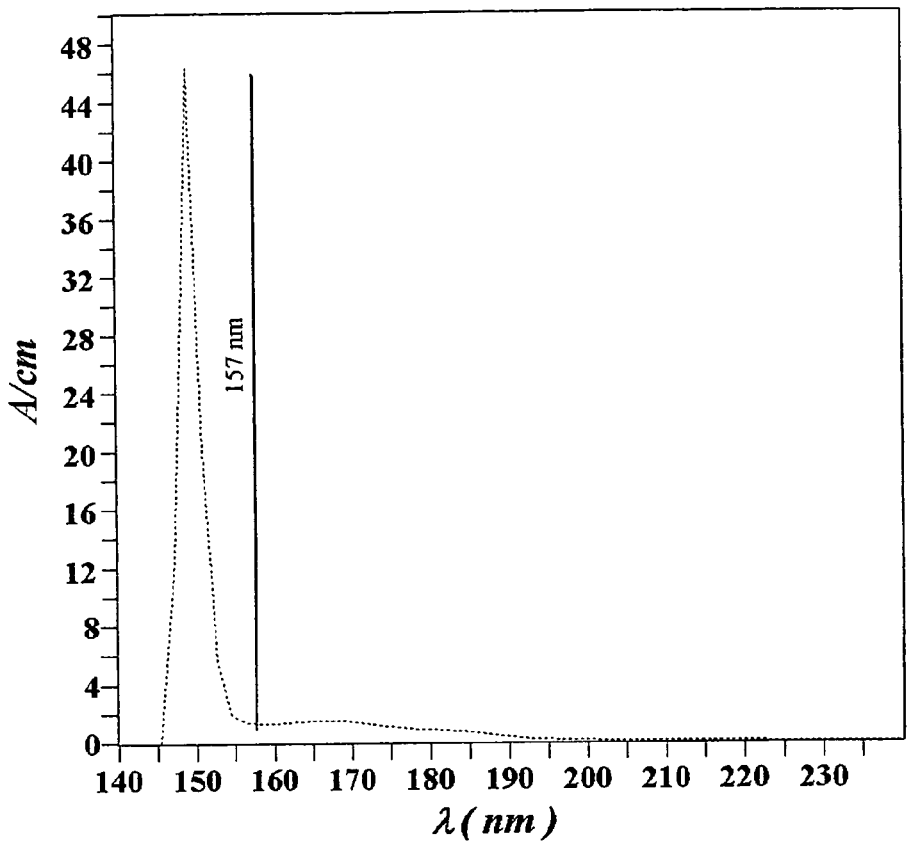
FIG. 11 shows the absorbance in units of inverse centimeters for Perfluoro-n-hexane (example 4) versus wavelength lambda (λ) in units of nanometers. Results below ~149 nm exhibit saturation of the absorbance measurement.
Figure 12:
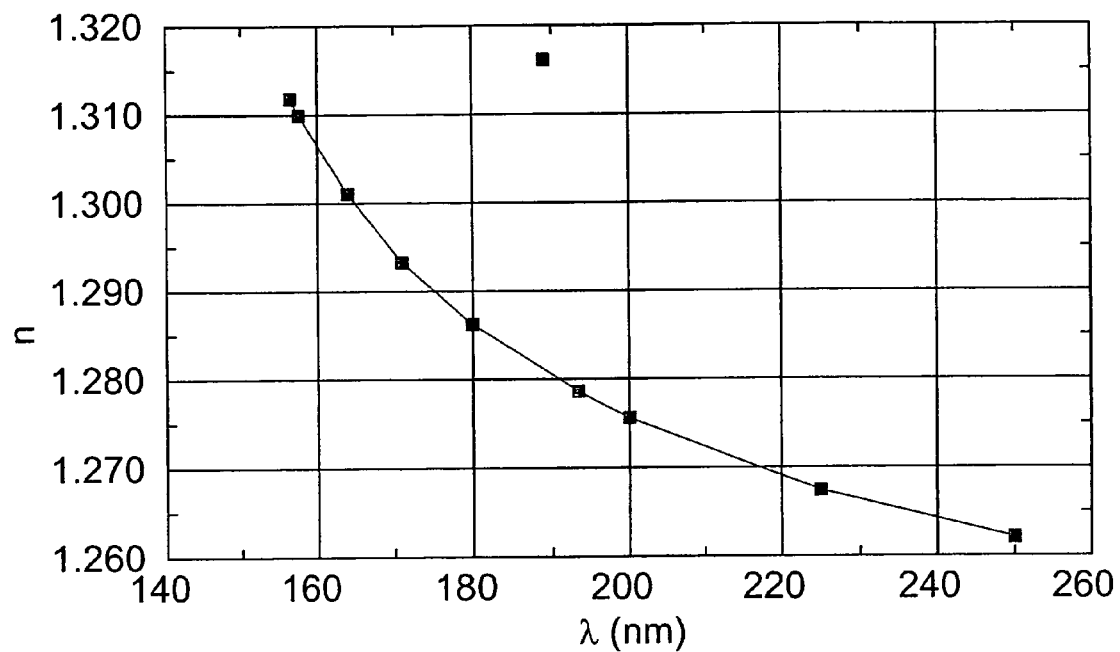
FIG. 12 shows (example 4) the index of refraction in absolute units for Perfluoro-n-hexane (example 4) versus wavelength lambda (λ) in units of nanometers.

The absorbance/centimeter of the sample was determined using the relative transmission method with cell thicknesses of 100/500/1450 micrometers, using the methods discussed above. The sample exposed to 3A molecular sieves was loaded in a nitrogen environment. The optical absorbance per centimeter at 157 nm was 1.33/cm, and the optical absorbance per centimeter at 193 nm was 0.23/cm. The results are shown in FIG. 11 and summarized in Table 1.

Example 4C

The index of refraction and its temperature coefficient was determined by the methods described above. The index of refraction at 157 nm and 31° C. was 1.312 and at 21.5° C. was 1.31562, and dn/dT was $-5.83 \times 10^4$.

Figure 16:
FIG. 16 shows (example 4) an optical micrograph of the immersion contact photolithography at 157 nm exposure wavelength image of the 50 mesh grid photomask printed using Perfluoro-n-hexane as the immersion fluid with a 1 mm fluid depth.
Figure 17:
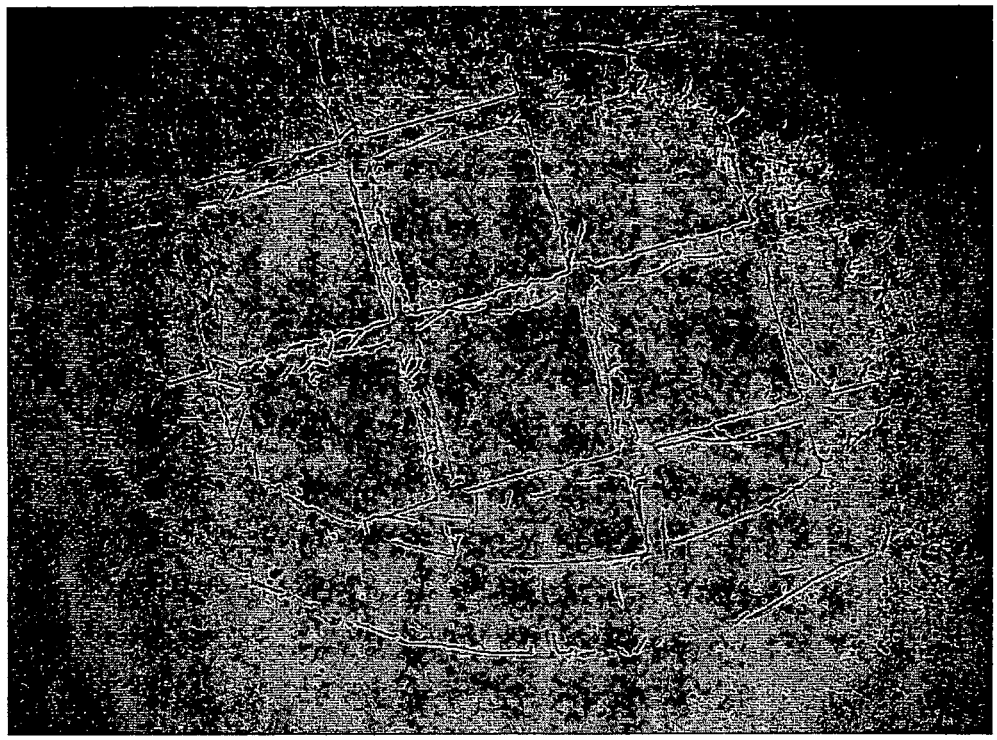
FIG. 17 shows (example 4) an optical micrograph of the dry contact photolithography at 157 nm exposure wavelength image, in which no immersion fluid is used, of the 50 mesh grid photomask printed.

Example 4D 157 nm Contact Immersion Photolithography at 157 nm Exposure Wavelength 157 nm contact immersion photolithography at 157 nm exposure wavelength was performed with the perfluoro-n-hexane immersion fluid at a depth (or optical path length in the fluid) of 1 mm. An optical micrograph of the lithographically printed image in the photoresist on the semiconductor wafer is shown in FIG. 16. The E0 clearing dose was 14 mJ/cm$^2$ and the E1 printing dose was 20 mJ/cm$^2$, the results are summarized in Table 3. The perfluoro-n-hexane was compatible with the photoresist, its latent image formation process, and did not interfere with the development and printing process.

Comparative Example 7

157 nm Contact Photolithography at 157 nm Exposure Wavelength

For comparison, 157 nm Contact Photolithography at 157 nm exposure wavelength was also performed without the use of an immersion fluid. An optical micrograph of the lithographically printed image in the photoresist on the semiconductor wafer is shown in FIG. 16. The E0 clearing dose was 10 mJ/cm$^2$ and the E1 printing dose was 12 mJ/cm$^2$. The high optical transparency of the immersion fluid lead to little change in the E0 and E1 doses for dry or wet contact photolithography at 157 nm exposure wavelength.

Example 5

Example 5

Deoxygenation of Perfluoro-n-hexane

Progress in the deoxygenation of perfluoro-n-hexane was followed using an Ocean Optics Inc. optical fiber oxygen sensor (FOXY 18-G), which employs 470 nm lights to stimulate 600 nm fluorescence in a ruthenium sensor in a process, which is quenched by oxygen. The high concentration calibration point was determined by performing a gas saturation experiment from which it was determined that the oxygen saturation concentration of perfluoro-n-hexane at one atmosphere and ca. 25° C. was 104 ppm. The low oxygen concentration calibration point was determined in different ways depending upon the deoxygenation method being employed.

A. Sparging with Nitrogen

The low concentration limit of the FOXY probe was calibrated by placing the sensor into an atmosphere prepared from boiled off liquid nitrogen, which should contain essentially no oxygen. This was chosen as the zero point on the sensor.

Perfluoro-n-hexane equilibrated with air was placed in a glass vessel equipped with the FOXY oxygen probe, an inlet for nitrogen gas, and an outlet for nitrogen gas. A nitrogen flow was started through the perfluoro-n-hexane and the level of oxygen followed using the FOXY probe. The nitrogen flow was deliberately slow, a small bubble roughly every second, so as to observe the effect. Dissolved oxygen concentration steadily dropped from 104 ppm to 0 ppm over about 19 minutes, that is, at the end point, the oxygen level of the perfluoro-n-hexane dropped from the saturation level to being indistinguishable from that of the nitrogen stream.

B. Freeze Thaw Cycles

To calibrate the zero-point of the sensor, the FOXY probe was subject to a vacuum at 0.192 Torr.

A 50 ml flask loaded with 25 ml of perfluoro-n-hexane was attached to a vacuum line with a diffusion pump. The FOXY probe was introduced into the flask via a side arm sealed with an Ultra-Torr reducing union. The perfluoro-n-hexane was first degassed using freeze/thaw cycles (repeated cycles of freezing the perfluoro-n-hexane with liquid N2, pulling pump vacuum while the perfluoro-n-hexane remained frozen, sealing off the flask, and then thawing). A series of calibration points was then determined according to the following method.

The perfluoro-n-hexane was then exposed to a low pressure of pure oxygen. At this point the FOXY probe, now set to read in torr of oxygen, found 154 ppm of oxygen in the gas phase above the perfluoro-n-hexane and 150 ppm oxygen when the ruthenium sol-gel tip of the probe was lowered and immersed in the liquid perfluoro-n-hexane. The probe was once again raised into the vapor phase after which the perfluoro-n-hexane was degassed by repeated freeze/thaw cycles. After the first cycle the vapor phase above the perfluoro-n-hexane measured 15 torr of oxygen and then 6.5 torr, 4 torr, and 3.5 torr upon subsequent degassing cycles. Twelve hours after the last degassing cycle, the FOXY probe still read 3.5 torr oxygen in the vapor phase above the perfluoro-n-hexane. Using Henry's law [$X_{O2}=P_{O2}$(torr)/144800 where X is the mole fraction of oxygen dissolved in the perfluoro-n-hexane], 3.5 torr of oxygen in the vapor phase above the liquid perfluoro-n-hexane translates into about 2 ppm by weight O2 dissolved in the liquid perfluoro-n-hexane.

What is claimed is:

1. A process comprising providing a surface, a light source emitting light in the wavelength range from 155 to 160 nm, and a perfluoro-n-alkane liquid disposed between said light source and said surface and causing said light source to illuminate at least a portion of said surface, such that at least a portion of said emitted light illuminating said surface is caused to be transmitted through said liquid, said liquid consisting essentially of perfluoro-n-pentane, perfluoro-n-hexane, or a mixture thereof.

2. The process of claim 1 wherein said perfluoro-n-alkane liquid has an oxygen concentration of <10 ppm, a water concentration of <10 ppm and absorbance of 0.1 to 10 cm−1.

3. The process of claim 2 wherein said oxygen concentration is less than 5 ppm and said absorbance is in the range of 0.1 to 2 cm−1.

4. The process of claim 3 wherein said oxygen concentration is less than 1 ppm and said absorbance is in the range of 0.1 to 1 cm−1.

5. The process of claim 1 wherein said light source is a laser, which emits light at 157 nm.

6. The process of claim 1 wherein said surface comprises a photoresist polymer.

7. The process of claim 6 wherein the photoresist surface is immersed in said liquid.

8. The process of claim 1 wherein said light source is a laser which emits light at 157 nm, said surface comprises a photoresist polymer, said surface is immersed in said liquid and wherein said light illuminating said surface causes an imagewise exposure of said surface.

9. The process of claim 8 further comprising extracting oxygen, water, and organic contaminants from said liquid prior to immersion of the photoresist surface in said liquid.

10. The process of claim 9 further comprising handling and maintaining the extracted liquid in an oxygen-minimized atmosphere.

11. The process of claim 9 wherein the extraction is effected by fractional distillation in a grease-free still to provide a condensate comprising a heart cut, and contacting the heart cut of the condensate thereof with a solid absorbent selected from the group consisting of silica gel, 3A zeolite molecular sieves, 4A zeolite molecular sieves, 5A zeolite molecular sieves, and mixtures thereof.

12. The process of claim 11 wherein said solid absorbent is a mixture.

* * * * *